United States Patent
Song et al.

(10) Patent No.: US 12,532,591 B2
(45) Date of Patent: Jan. 20, 2026

(54) DISPLAY DEVICE HAVING PARTITION WALL STRUCTURE THAT FINELY DIVIDES WAVELENGTH CONVERSION PORTIONS

(71) Applicant: Samsung Display Co., LTD., Yongin-si (KR)

(72) Inventors: Dae Ho Song, Yongin-si (KR); Soo Chul Kim, Yongin-si (KR); Jin Taek Park, Yongin-si (KR); So Young Yeo, Yongin-si (KR); Ok Yi Lee, Yongin-si (KR); Joo Woan Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 815 days.

(21) Appl. No.: 17/684,554

(22) Filed: Mar. 2, 2022

(65) Prior Publication Data

US 2022/0352247 A1    Nov. 3, 2022

Related U.S. Application Data

(60) Provisional application No. 63/182,193, filed on Apr. 30, 2021.

(30) Foreign Application Priority Data

Apr. 30, 2021    (KR) .......................... 10-2021-0056922

(51) Int. Cl.
*H10H 29/14*    (2025.01)
*H10H 20/01*    (2025.01)
(Continued)

(52) U.S. Cl.
CPC ........ *H10H 29/142* (2025.01); *H10H 20/851* (2025.01); *H10H 20/856* (2025.01);
(Continued)

(58) Field of Classification Search
CPC .. H10H 29/142; H10H 20/851; H10H 20/857; H10H 20/856
(Continued)

(56) References Cited

U.S. PATENT DOCUMENTS 9,954,028 B2    4/2018  Yeon et al.
10,008,645 B2   6/2018  Bonar et al.
(Continued)

FOREIGN PATENT DOCUMENTS

JP       6131374           5/2017
KR    10-2018-0009116      1/2018
(Continued)

OTHER PUBLICATIONS

Kai-Ling Liang et al., "Advances in color-converted micro-LED arrays", Japanese Journal of Applied Physics, Oct. 16, 2020, pp. 1-9, vol. 60, No. SA0802.
(Continued)

*Primary Examiner* — Eric W Jones
*Assistant Examiner* — Colin Russell McCutcheon
(74) *Attorney, Agent, or Firm* — CANTOR COLBURN LLP

(57) ABSTRACT

A display device may include a display element part disposed on a substrate and including a light emitting element, and a color conversion part disposed on the display element part and changing a wavelength of light emitted from the light emitting element. The color conversion part may include an insulating structure layer, a first partition wall structure layer, and a first wavelength conversion portion, the first partition wall structure layer may include first walls, and may be disposed between the insulating structure layer and the display element part, the first wavelength conversion
(Continued)

portion may be disposed in a space defined by the first walls, and the first partition wall structure layer may include a silicon-based material.

15 Claims, 14 Drawing Sheets

(51) Int. Cl.
*H10H 20/851* (2025.01)
*H10H 20/856* (2025.01)
*H10H 20/857* (2025.01)

(52) U.S. Cl.
CPC ....... *H10H 20/857* (2025.01); *H10H 20/0361* (2025.01); *H10H 20/0363* (2025.01)

(58) Field of Classification Search
USPC .......................................................... 257/89
See application file for complete search history.

(56) References Cited

U.S. PATENT DOCUMENTS

| | | | |
|---|---|---|---|
| 10,062,675 B2 | 8/2018 | Chang et al. | |
| 10,325,893 B2 | 6/2019 | Chong et al. | |
| 10,600,767 B2 | 3/2020 | Chong et al. | |
| 10,636,349 B2 | 4/2020 | Shin et al. | |
| 10,985,218 B2 | 4/2021 | Park et al. | |
| 11,469,287 B2 | 10/2022 | Lee et al. | |
| 11,971,616 B1* | 4/2024 | Wyatt | G09G 3/3413 |
| 2017/0309798 A1* | 10/2017 | Bonar | H10H 20/856 |
| 2018/0308420 A1* | 10/2018 | Shin | G09G 3/14 |
| 2019/0123033 A1* | 4/2019 | Martin | H10H 20/8585 |
| 2019/0378873 A1* | 12/2019 | Lee | H10H 29/41 |
| 2020/0091464 A1* | 3/2020 | Park | H10K 59/30 |
| 2020/0343410 A1* | 10/2020 | Iguchi | G09G 3/32 |
| 2022/0199695 A1* | 6/2022 | Takiguchi | H10K 59/877 |

FOREIGN PATENT DOCUMENTS

| | | |
|---|---|---|
| KR | 10-2018-0017914 | 2/2018 |
| KR | 10-2018-0024228 | 3/2018 |
| KR | 10-2018-0118488 | 10/2018 |
| KR | 10-1968592 | 4/2019 |
| KR | 10-2019-0127872 | 11/2019 |
| KR | 10-2020-0088923 | 7/2020 |
| KR | 10-2020-0140966 | 12/2020 |
| KR | 10-2295569 | 8/2021 |

OTHER PUBLICATIONS

SEIREN KST Corp., "SOI Wafer of SEIREN KST", SOI Wafer, https://www.kst.seiren.com/eng/service4/.

* cited by examiner

DISPLAY DEVICE HAVING PARTITION WALL STRUCTURE THAT FINELY DIVIDES WAVELENGTH CONVERSION PORTIONS

CROSS-REFERENCE TO RELATED APPLICATION(S)

This application claims the benefit of U.S. Provisional Application No. 63/182,193 filed on Apr. 30, 2021, in the United States Patent and Trademark office, and priority to Korean Patent Application No. 10-2021-0056922, filed on Apr. 30, 2021, and all the benefits accruing therefrom under 35 U.S.C. § 119, the content of which in its entirety is herein incorporated by reference.

BACKGROUND

1. Technical Field

The disclosure relates to a display device and a method of manufacturing the same.

2. Description of the Related Art

In recent years, as interest in information display is increasing, research and development for a display device are continuously being conducted.

SUMMARY

An object of the disclosure is to provide a display device having a high resolution by efficiently securing an area in which a wavelength conversion portion is disposed, and a method of manufacturing the display device.

Another object of the disclosure is to provide a display device having improved light emission efficiency, and a method of manufacturing the display device.

Objects of the disclosure are not limited to the above-described object, and other technical objects which are not described will be clearly understood by those skilled in the art from the following description.

According to an embodiment of the disclosure, a display device may be provided. The display device may include a display element part disposed on a substrate and including a light emitting element, and a color conversion part disposed on the display element part and changing a wavelength of light emitted from the light emitting element. The color conversion part may include an insulating structure layer, a first partition wall structure layer, and a first wavelength conversion portion, the first partition wall structure layer may include first walls, and may be disposed between the insulating structure layer and the display element part, the first wavelength conversion portion may be disposed in a space defined by the first walls, and the first partition wall structure layer may include a silicon-based material.

According to an embodiment, the first partition wall structure layer may have a height of about 3 μm or more, and the insulating structure layer may have a height of about 3 μm or less.

According to an embodiment, the first walls may have a thickness of about 0.3 μm to about 3.0 μm, and the first walls may be spaced apart from each other by about 1.5 μm to about 7.0 μm.

According to an embodiment, the first walls may be spaced apart by a distance, each of the first walls may have a thickness, and a ratio of the distance to the thickness may be about 1 to about 5.

According to an embodiment, the color conversion part may include a second wavelength conversion portion separated from the first wavelength conversion portion by at least part of the first walls, and the first wavelength conversion portion and the second wavelength conversion portion may include a first wavelength conversion material and a second wavelength conversion material, respectively.

According to an embodiment, the color conversion part may include a second wavelength conversion portion separated from the first wavelength conversion portion by at least part of the first walls, and a light transmission portion separated from the second wavelength conversion portion by other part of the first walls, the first wavelength conversion portion may include a first wavelength conversion material, the second wavelength conversion portion may include a second wavelength conversion material, and the light transmission portion may include a filler.

According to an embodiment, the display device may further include a first reflective layer disposed on an inner surface of the first walls.

According to an embodiment, the display device may further include a protective layer disposed on the first partition wall structure layer, a second partition wall structure layer disposed on the protective layer and including second walls, and an additional wavelength conversion portion disposed in a space defined by the second walls.

According to an embodiment, the display device may further include a display area and a non-display area surrounding at least a portion of the display area, a common electrode disposed in the non-display area, a first bump electrically connected to the light emitting element, a second bump electrically connected to the common electrode, and a CMOS cell electrically connected to the light emitting element through the first bump.

According to an embodiment, the display device may further include a color filter part disposed on the color conversion part, the color conversion part may include a third wavelength conversion portion separated by other part of the first walls and including the first wavelength conversion material and the second wavelength conversion material, the color filter part may include a first color filter overlapping the first wavelength conversion portion in a plan view, a second color filter overlapping the second wavelength conversion portion in a plan view, and a third color filter overlapping the third wavelength conversion portion in a plan view, at least one of the first wavelength conversion portion, the first color filter, and the light emitting element may define a first pixel, at least one of the second wavelength conversion portion, the second color filter, and the light emitting element may define a second pixel, and at least one of the third wavelength conversion portion, the third color filter, and the light emitting element may define a third pixel.

According to an embodiment, the insulating structure layer may include silicon oxide ($SiO_x$).

According to another embodiment of the disclosure, a method of manufacturing a display device may be provided. The method may include providing a display element part including a light emitting element, and providing a color conversion part changing a wavelength of light emitted from the light emitting element. The providing of the color conversion part may include providing a silicon on insulator (SOI) substrate including a base substrate including a silicon-based material, an insulating structure layer disposed on the base substrate, and a first base structure layer disposed on the insulating structure layer, providing a first partition wall structure layer including first walls, by etching the first base structure layer, and providing a wavelength conversion portion in a space defined by the first walls.

According to an embodiment, the insulating structure layer may include silicon oxide ($SiO_x$).

According to an embodiment, the first walls may have a thickness of about 0.3 μm to about 3.0 μm, and the first walls may be spaced apart from each other by about 1.5 μm to about 7.0 μm.

According to an embodiment, the providing of the SOI substrate may include forming a first insulating layer on the base substrate, forming a second insulating layer on the first base structure layer, and combining the first insulating layer and the second insulating layer, and the first insulating layer and the second insulating layer combined to each other may be provided as the insulating structure layer.

According to an embodiment, the method may further include combining the display element part and the color conversion part, the providing of the display element part may include sequentially stacking a first semiconductor layer, an active layer, and a second semiconductor layer on a stack substrate, and removing at least a portion of each of the first semiconductor layer, the active layer, and the second semiconductor layer to provide the light emitting element separated from each other.

According to an embodiment, the method may further include depositing a base reflective layer to overlap the first partition wall structure layer in a plan view, and removing at least a portion of the base reflective layer disposed on an upper surface of the first partition wall structure layer.

According to an embodiment, the method may further include forming a first protective layer on the first partition wall structure layer, forming a second base structure layer on the first protective layer, providing a second partition wall structure layer including second walls, by etching the second base structure layer, and providing an additional wavelength conversion portion in a space defined by the second walls.

According to an embodiment, the wavelength conversion portion and the additional wavelength conversion portion may include a same material.

According to an embodiment, the wavelength conversion portion and the additional wavelength conversion portion may include different materials.

A solution means of the object of the disclosure is not limited to the above-described solution means, and solution means which are not described will be clearly understood by those skilled in the art from the specification and the accompanying drawings.

According to an embodiment of the disclosure, a display device having a high resolution by efficiently securing an area in which a wavelength conversion portion is disposed, and a method of manufacturing the display device may be provided.

According to another embodiment of the disclosure, a display device having improved light emission efficiency, and a method of manufacturing the display device may be provided.

An effect of the disclosure is not limited to the above-described effects, and effects which are not described will be clearly understood by those skilled in the art from the specification and the accompanying drawings.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1:
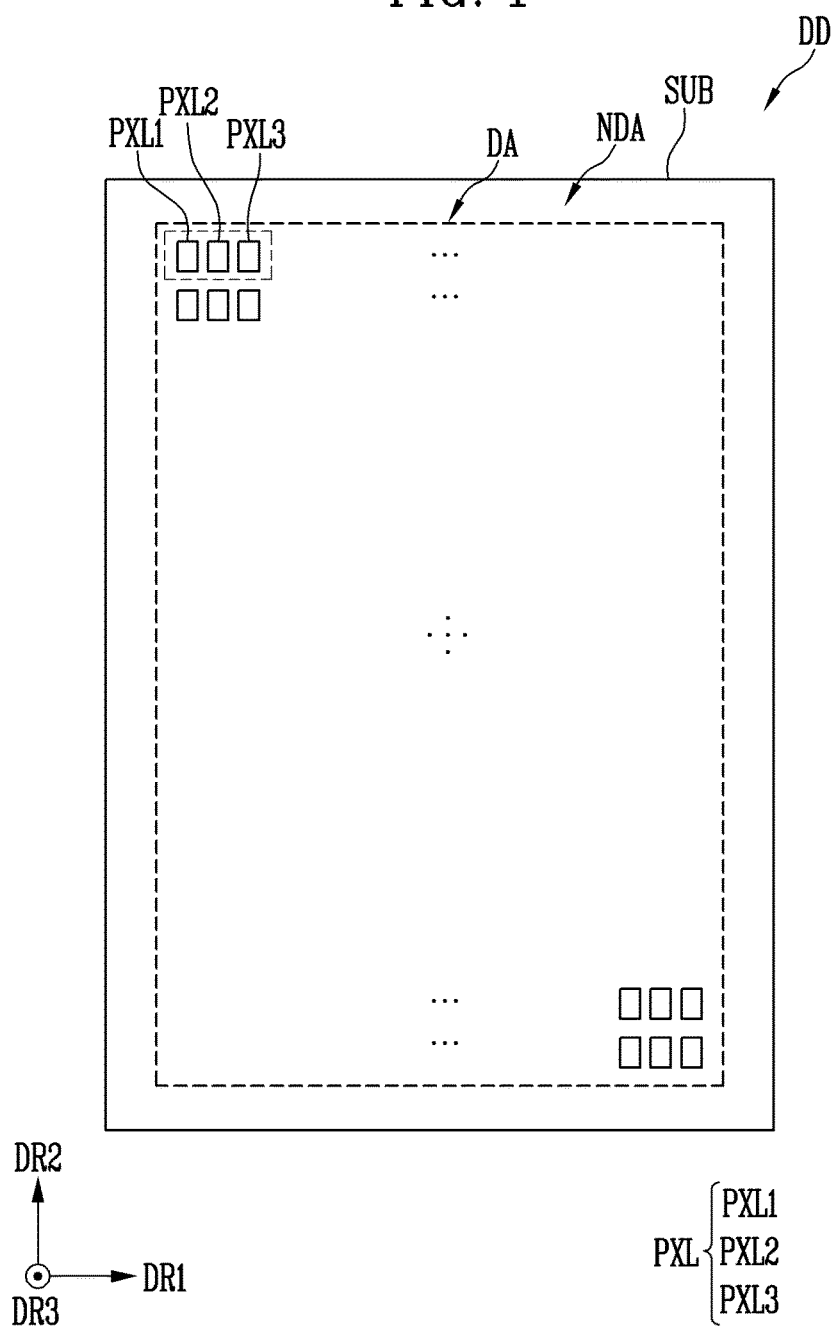
FIG. 1 is a schematic plan view illustrating a display device according to an embodiment.

Since the embodiment described in the specification is for clearly describing the spirit of the disclosure to those skilled in the art to which the disclosure pertains, the disclosure is not limited by the embodiment described in the specification, and the scope of the disclosure should be interpreted as including modifications or variations that do not depart from the spirit of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The drawings attached to the specification are intended to describe the disclosure. Since the shape shown in the drawings may be exaggerated and displayed as necessary to help understanding of the disclosure, the disclosure is not limited by the drawings.

In the specification, when it is determined that detailed description of a known configuration or function related to the disclosure may obscure the subject matter of the disclosure, detailed description thereof will be omitted as necessary.

It will be understood that the terms "contact," "connected to," and "coupled to" may include a physical and/or electrical contact, connection, or coupling.

The disclosure relates to a display device and a method of manufacturing the same. Hereinafter, a display device and a method of manufacturing the same according to an embodiment are described with reference to FIGS. 1 to 24.

FIG. 1 is a schematic plan view illustrating a display device according to an embodiment.

The display device DD according to an embodiment may be configured to emit light. For example, the display device DD may be a wearable device including a watch, a smart glass, an automotive electronic device, a tablet PC, a television, a smart phone, or a notebook computer. However, the disclosure is not limited thereto. According to an embodiment, the display device DD may be applied to a transparent display device configured to transmit light.

Referring to FIG. 1, the display device DD may include a substrate SUB and a pixel PXL disposed on the substrate SUB. Although not shown in the drawing, the display device DD may further include a driving circuit unit (for example, a scan driver and a data driver) for driving the pixel PXL, lines, and pads.

According to an example, the pixel PXL may include a first pixel PXL1, a second pixel PXL2, and a third pixel PXL3.

According to an embodiment, the display device DD may include a display area DA and a non-display area NDA. The non-display area NDA may mean an area other than the display area DA. The non-display area NDA may surround at least a portion of the display area DA.

The substrate SUB may configure a base member of the display device DD. The substrate SUB may be a rigid or flexible substrate or film. For example, the substrate SUB may include a Si substrate or a PCB substrate, but embodiments are not limited thereto According to an embodiment, the display area DA may mean an area in which the pixel PXL is disposed. The non-display area NDA may mean an area in which the pixel PXL is not disposed. The driving circuit portion, the lines, and the pads connected to the pixel PXL of the display area DA may be disposed in the non-display area NDA.

According to an example, the pixel PXL may be arranged according to a stripe or PENTILE™ arrangement structure or the like, but is not limited thereto.

According to an embodiment, two or more types of pixels PXL emitting light of different colors may be disposed in the display area DA. For example, in the display area DA, the first pixel PXL1 emitting light of a first color, the second pixel PXL2 emitting light of a second color, and the third pixel PXL3 emitting light of a third color may be arranged.

According to an embodiment, at least one of the first to third pixels PXL1, PXL2, and PXL3 disposed adjacent to each other may configure one pixel unit capable of emitting light of various colors. For example, each of the first to third pixels PXL1, PXL2, and PXL3 may be a sub-pixel emitting light of a predetermined color. For example, the first pixel PXL1 may be a red pixel emitting red light, the second pixel PXL2 may be a green pixel emitting green light, and the third pixel PXL3 may be a blue pixel emitting blue light. However, the color, type, number, and/or the like of the pixels PXL configuring each pixel unit are/is not limited to a specific example.

Figure 2:
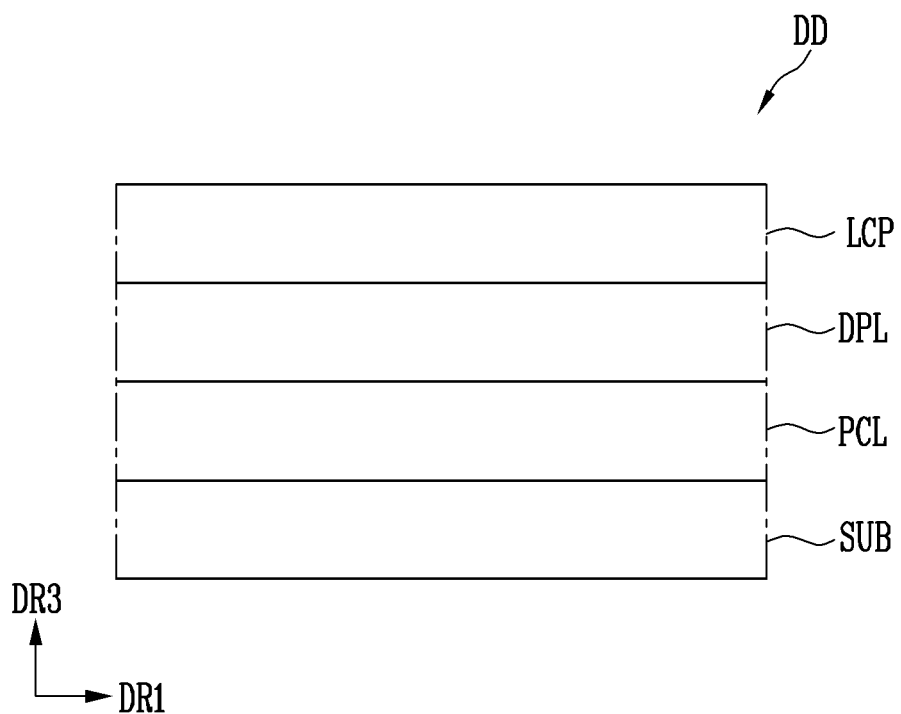
FIG. 2 is a schematic cross-sectional view illustrating a display device according to an embodiment.

FIG. 2 is a schematic cross-sectional view illustrating a display device according to an embodiment.

According to an embodiment, the display device DD may include the substrate SUB, a pixel circuit part PCL, a display element part DPL, and a light control part LCP. According to an example, the substrate SUB, the pixel circuit part PCL, the display element part DPL, and the light control part LCP may be sequentially stacked in a display direction (for example, a third direction DR3) of the display device DD.

The substrate SUB may configure a base surface of the display device DD. An individual configuration of the display device DD may be disposed on the substrate SUB.

The pixel circuit part PCL may be disposed on the substrate SUB. The pixel circuit part PCL may include an integrated circuit for driving the pixel PXL. The pixel circuit part PCL may include a transistor electrically connected to a light emitting element (refer to 'LD' of FIG. 3) disposed in the display element part DPL.

For example, the pixel circuit part PCL may include a CMOS cell (refer to 'CE1' of FIG. 3) including two transistors and one capacitor. Here, the CMOS cell CE1 may be electrically connected to the light emitting element LD. The pixel circuit part PCL may include a common cell (refer to 'CE2' of FIG. 3) configured to provide a signal (e.g., a ground signal) to the light emitting element LD.

The display element part DPL may be disposed on the pixel circuit part PCL. The display element part DPL may emit light based on an electrical signal provided from the pixel circuit part PCL (for example, the CMOS cell CE1 and the common cell CE2). For example, the display element part DPL may include light emitting elements LD. The light emitted from the display element part DPL may pass through the light control part LCP and may be provided to an outside.

The light control part LCP may be disposed on the display element part DPL. The light control part LCP may change a wavelength of the light provided from the display element part DPL. According to an example, the light control part LCP may include a color conversion part CCL configured to change a wavelength of light and a color filter part CFL configured to transmit light having a specific wavelength.

Hereinafter, a display device DD according to individual embodiments is described with reference to FIGS. 3 to 6.

Figure 3:
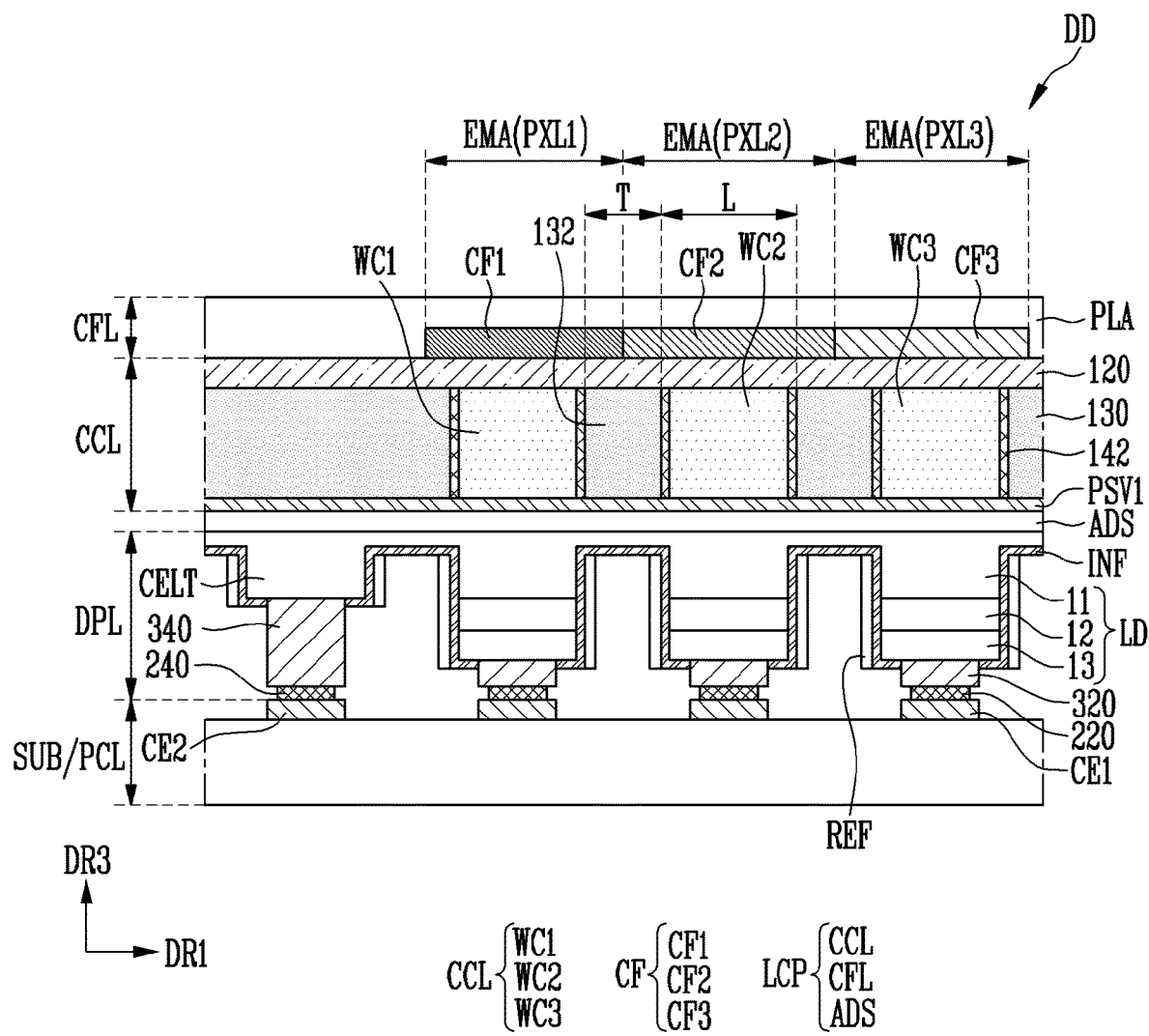
FIG. 3 is a schematic cross-sectional view illustrating a display device according to a first embodiment.
Figure 4:
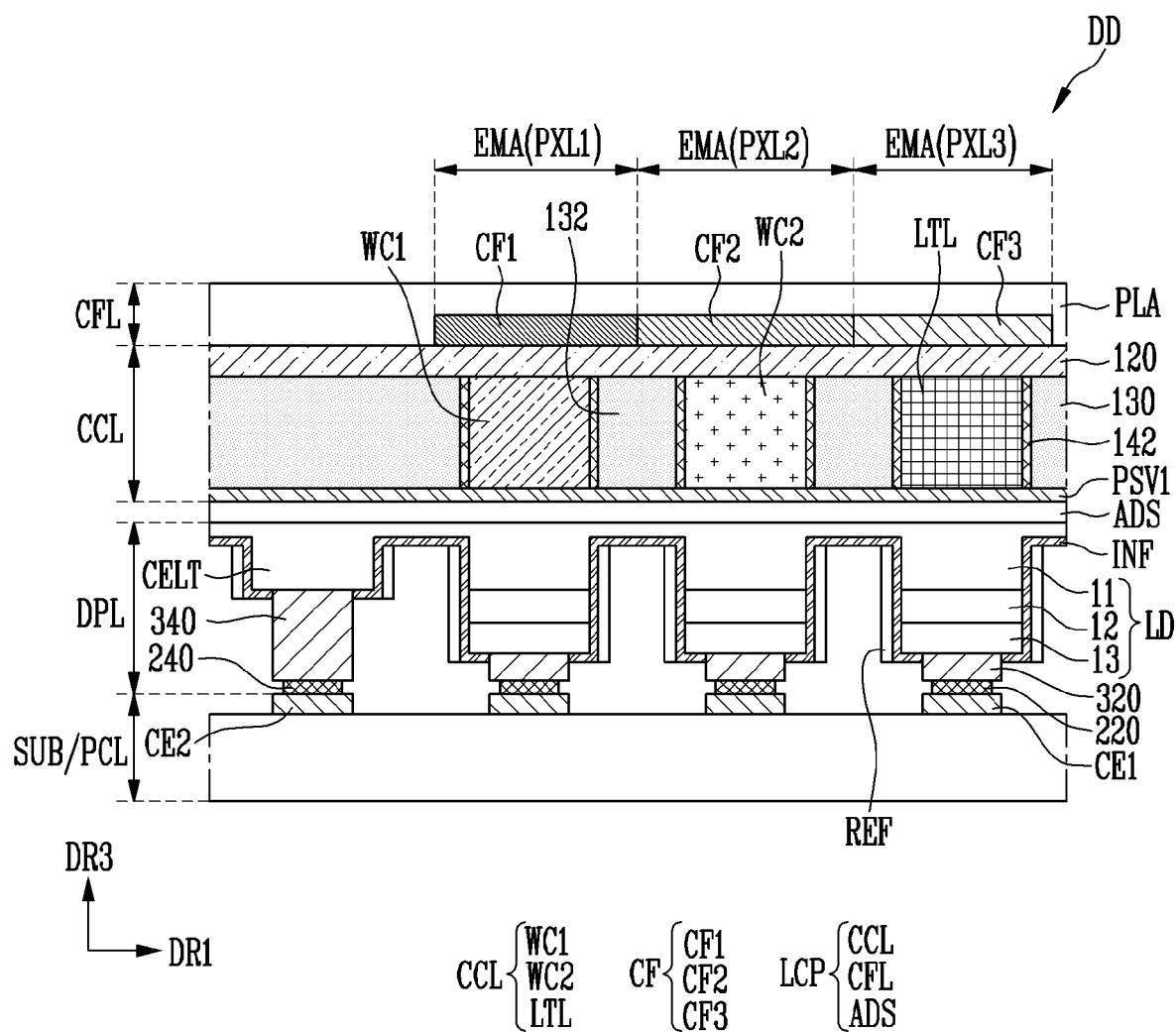
FIG. 4 is a schematic cross-sectional view illustrating a display device according to a second embodiment.
Figure 5:
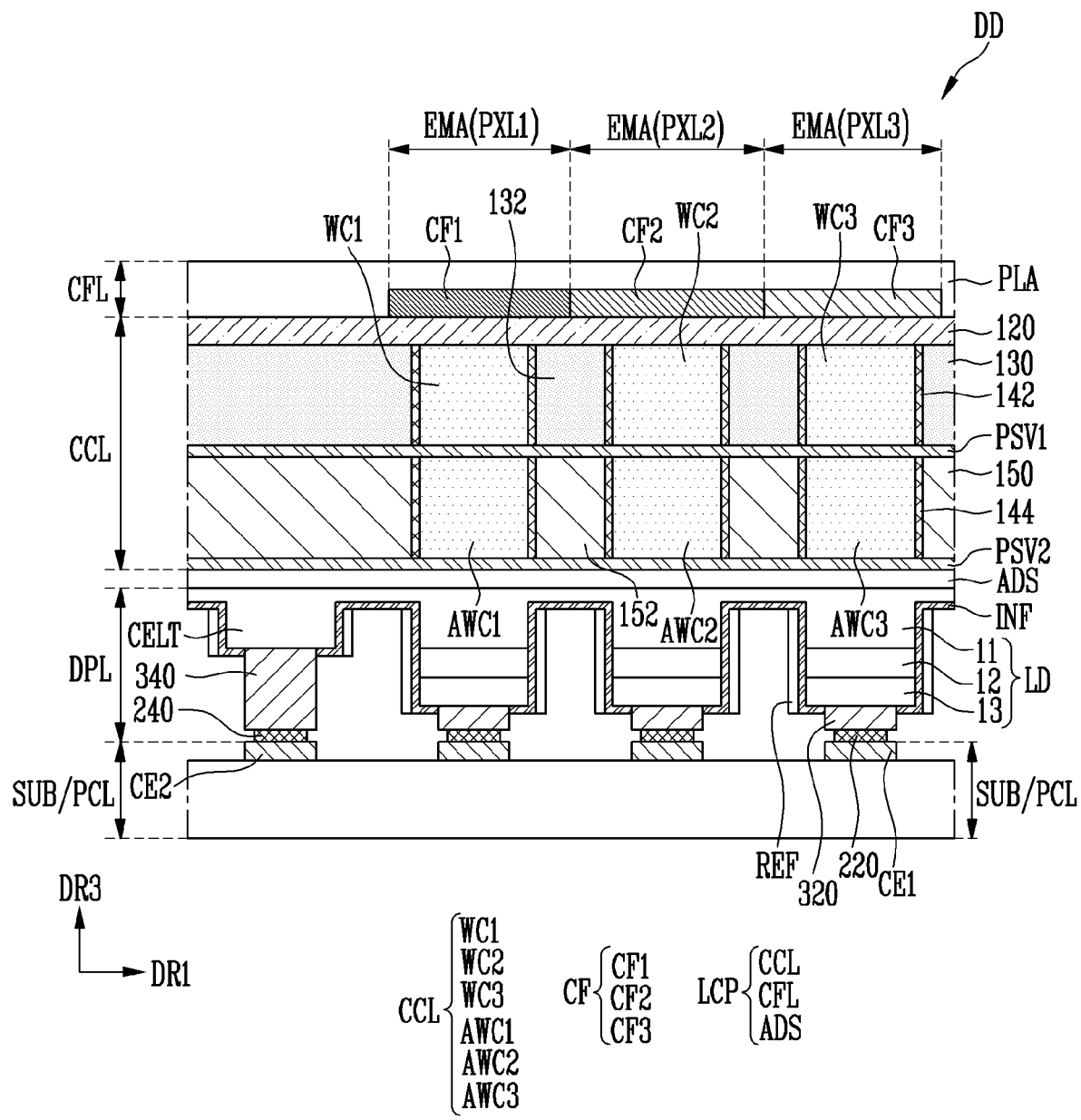
FIG. 5 is a schematic cross-sectional view illustrating a display device according to a third embodiment.
Figure 6:
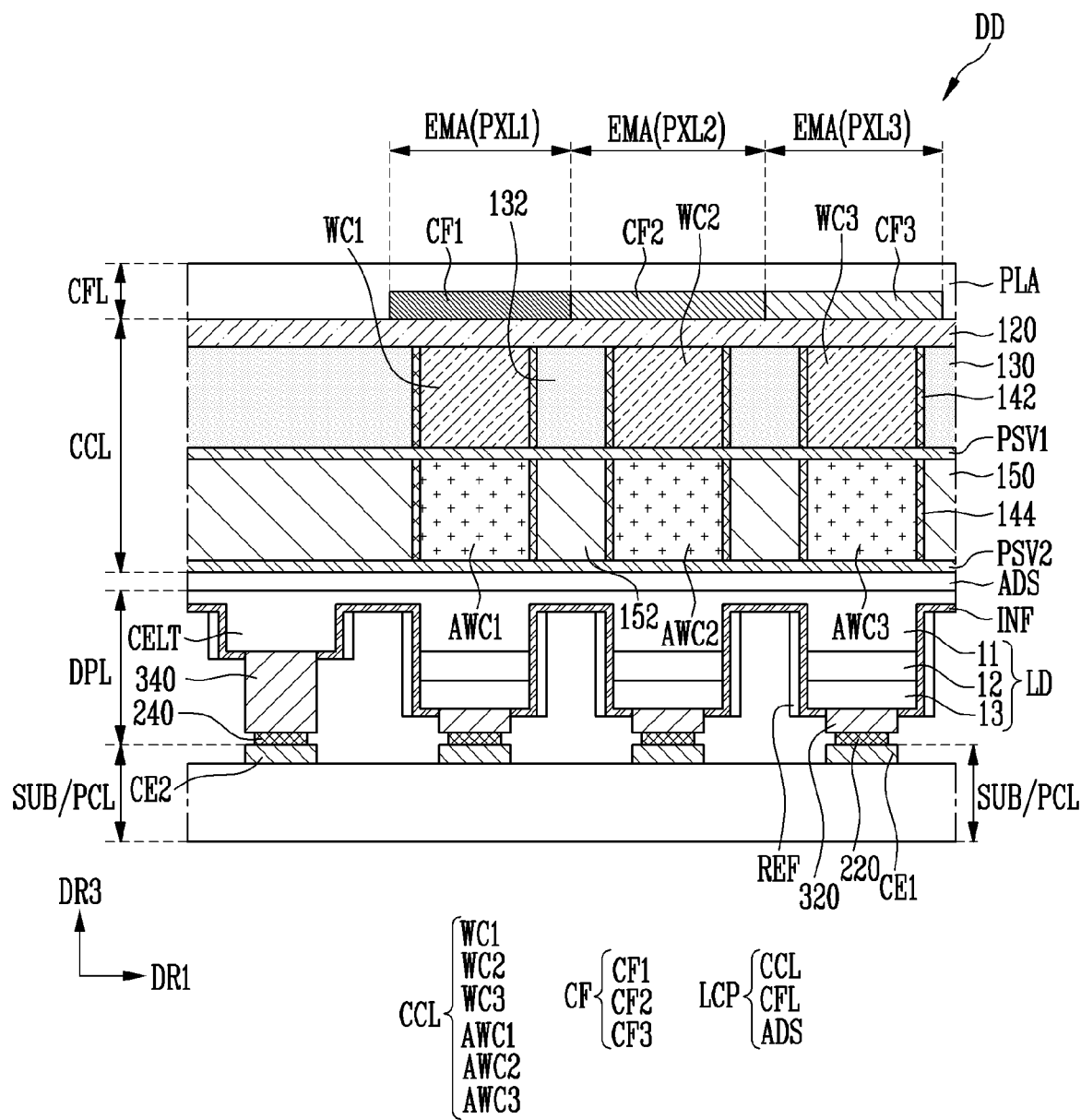
FIG. 6 is a schematic cross-sectional view illustrating a display device according to a fourth embodiment.

FIG. 3 is a schematic cross-sectional view illustrating a display device according to a first embodiment. FIG. 4 is a schematic cross-sectional view illustrating a display device according to a second embodiment. FIG. 5 is a schematic cross-sectional view illustrating a display device according to a third embodiment. FIG. 6 is a schematic cross-sectional view illustrating a display device according to a fourth embodiment.

First, the display device DD according to the first embodiment is described with reference to FIG. 3.

FIG. 3 shows a structure including the first pixel PXL1, the second pixel PXL2, and the third pixel PXL3 as an example.

According to an embodiment, the display element part DPL may include the CMOS cell CE1, the common cell CE2, a first conductive connector 220, a second conductive connector 240, a first bump 320, a second bump 340, the light emitting element LD, an insulating layer (or passivation layer) INF, a reflective partition wall (or reflective wall) REF, and a common electrode CELT.

According to an embodiment, the CMOS cell CE1 may be electrically connected to the light emitting element LD. For example, the CMOS cell CE1 may be connected to the light emitting element LD through the first conductive connector 220 and the first bump 320. According to an example, the CMOS cell CE1 may individually drive the connected pixel PXL (for example, any one of the first to third pixels PXL1 to PXL3).

According to an embodiment, the common cell CE2 may be electrically connected to the common electrode CELT. For example, the common cell CE2 may be connected to the common electrode CELT through the second conductive connector 240 and the second bump 340. According to an example, the CMOS cell CE1 and the common cell CE2 may be patterned in the same process.

According to an embodiment, the first conductive connector 220 may include a conductive material. The first conductive connector 220 may be a connection member for combining the separately provided CMOS cell CE1 and the first bump 320.

According to an embodiment, the second conductive connector 240 may include a conductive material. The second conductive connector 240 may be a connection member for combining the separately provided common cell CE2 and the second bump 340.

According to an embodiment, the first bump 320 may connect the light emitting element LD and the first conductive connector 220. For example, the first bump 320 may connect a second semiconductor layer 13 of the light emitting element LD to the CMOS cell CE1 through the first conductive connector 220. For example, the first bump 320 may be a configuration for connecting the light emitting elements LD provided in a chip form to the pixel circuit part PCL. According to an embodiment, the first bump 320 and the second bump 340 may include a conductive material, for example, a metal.

According to an embodiment, the second bump 340 may connect the common electrode CELT and the second conductive connector 240. According to an example, the first bump 320 and the second bump 340 may be formed in the same process.

According to an embodiment, the light emitting element LD may be electrically connected to the CMOS cell CE1 and the common cell CE2. The light emitting element LD may emit light based on a first electrical signal (for example, an anode signal) provided from the CMOS cell CE1 and a second electrical signal (for example, a cathode signal) provided from the common cell CE2.

According to an embodiment, the light emitting element LD may include a first semiconductor layer 11, an active layer 12, and the second semiconductor layer 13. According to an example, the light emitting element LD may have a column shape. However, the shape of the light emitting element LD is not limited thereto.

According to an embodiment, the first semiconductor layer 11 may be disposed on a surface of the active layer 12. The first semiconductor layer 11 may be a semiconductor layer having a first conductivity type (for example, an N-type). For example, the first semiconductor layer 11 may include a semiconductor material of any one of InAlGaN, GaN, AlGaN, InGaN, AlN, and InN, and may include an N-type semiconductor doped with a first conductivity type dopant such as Si, Ge, or Sn.

According to an embodiment, the first semiconductor layer 11 may be electrically connected to the common electrode CELT formed in the non-display area NDA. The first semiconductor layer 11 may receive an electrical signal applied from the common cell CE2 through the common electrode CELT.

According to an embodiment, the active layer 12 may be disposed (or interposed) between the first semiconductor layer 11 and the second semiconductor layer 13. The active layer 12 may be formed in a single-quantum well or multi-quantum well structure.

According to an embodiment, the second semiconductor layer 13 may be disposed on another surface of the active layer 12. The second semiconductor layer 13 may be positioned closer to the CMOS cell CE1 than the first semiconductor layer 11. The second semiconductor layer 13 may be a semiconductor layer having a second conductivity type (for example, a P-type). For example, the second semiconductor layer 13 may include at least one semiconductor material among InAlGaN, GaN, AlGaN, InGaN, AlN, and InN, and may include a P-type semiconductor layer doped with a second conductivity type dopant such as Mg.

According to an embodiment, the second semiconductor layer 13 may receive an electrical signal applied from the CMOS cell CE1 through the first conductive connector 220 and the first bump 320.

According to an embodiment, when a voltage equal to or greater than a threshold voltage is applied to ends (for example, an end of the first semiconductor layer 11 and an end of the second semiconductor layer 13) of the light emitting element LD, the light emitting element LD may emit light while an electron-hole pair is combined in the active layer 12.

According to an embodiment, the common electrode CELT may receive an electrical signal from the common cell CE2. The common electrode CELT may be electrically connected to the first semiconductor layer 11 to electrically connect the first semiconductor layer 11 and the common cell CE2. According to an example, the common electrode CELT and the first semiconductor layer 11 may be formed in the same process.

According to an embodiment, the display element part DPL may further include the insulating layer INF. The insulating layer INF may cover at least a portion of each of the light emitting element LD and the common electrode CELT. According to an example, the insulating layer INF may include at least one insulating material, e.g., among silicon oxide ($SiO_x$), silicon nitride ($SiN_x$), silicon oxynitride ($SiO_xN_y$), aluminum oxide ($AlO_x$), hafnium oxide ($HfO_x$), and titanium oxide ($TiO_x$), but is not limited thereto. The insulating layer INF may have a thickness of about 1 nm to about 100 nm, but is not limited thereto.

According to an embodiment, the display element part DPL may further include the reflective partition wall REF. The reflective partition wall REF may be disposed on an outer surface of the light emitting element LD. The reflective partition wall REF may be disposed on the insulating layer INF formed on the outer surface of the light emitting element LD. The reflective partition wall REF may have a thickness of about 1 nm to about 100 nm, but is not limited thereto.

According to an embodiment, the reflective partition wall REF may include a reflective material. For example, the reflective partition wall REF may include an Al or Ag-based material, but is not limited thereto. The reflective partition wall REF may reflect light emitted from the light emitting element LD in the display direction (for example, the third direction DR3) of the display device DD to improve light emission efficiency.

According to an embodiment, the light control part LCP may include an adhesive layer ADS, a color conversion part CCL, and a color filter part CFL. According to an example, one surface of the color conversion part CCL may be adjacent to the display element part DPL, and another surface of the color conversion part CCL may be adjacent to the color filter part CFL.

According to an embodiment, a position of each individual configuration of the color conversion part CCL and the color filter part CFL may define an individual pixel PXL. For example, a first wavelength conversion portion WC1 and a first color filter CF1 may define the first pixel PXL1, a second wavelength conversion portion WC2 and a second color filter CF2 may define the second pixel PXL2, and a third wavelength conversion portion WC3 and a third color filter CF3 may define the third pixel PXL3.

According to an embodiment, each of the first pixel PXL1, the second pixel PXL2, and the third pixel PXL3 may include a predetermined (or selected) number of light emitting elements LD. For example, FIG. 3 shows an embodiment in which a light emitting element LD is disposed in each of the first pixel PXL1, the second pixel PXL2, and the third pixel PXL3. However, the number of light emitting elements LD disposed in each of the individual pixels PXL is not limited to a specific example.

According to an embodiment, the adhesive layer ADS may be interposed between the color conversion part CCL and the display element part DPL. The adhesive layer ADS may combine the color conversion part CCL and the display element part DPL. The adhesive layer ADS may include a material having an adhesive property, and is not limited to a specific example.

According to an embodiment, the color conversion part CCL may include a first protective layer PSV1, a first partition wall structure layer (or first layer including partition walls or banks) 130, a first reflective layer 142, the first wavelength conversion portion WC1, the second wavelength conversion portion WC2, the third wavelength conversion portion WC3, and an insulating structure layer 120.

According to an embodiment, the first protective layer PSV1 may be disposed between the adhesive layer ADS and the first partition wall structure layer 130 and/or the first to third wavelength conversion portions WC1 to WC3. The first protective layer PSV1 may cover (or overlap in a plan view) the first wavelength conversion portion WC1, the second wavelength conversion portion WC2, and the third wavelength conversion portion WC3. The first protective layer PSV1 may include an organic material or an inorganic material, but is not limited to a specific example.

According to an embodiment, the first wavelength conversion portion WC1 may be disposed in an emission area EMA of the first pixel PXL1, the second wavelength conversion portion WC2 may be disposed in an emission area EMA of the second pixel PXL2, and the third wavelength conversion portion WC3 may be disposed in an emission area EMA of the third pixel PXL3.

According to an embodiment, the first wavelength conversion portion WC1, the second wavelength conversion portion WC2, and the third wavelength conversion portion WC3 may be disposed in a space defined by the first partition wall structure layer 130. The first partition wall structure layer 130 may include first walls (or first banks) 132. The first partition wall structure layer 130 may include openings.

For example, the first wavelength conversion portion WC1 may be disposed in a first space defined by the first walls 132 of the first partition wall structure layer 130, the second wavelength conversion portion WC2 may be disposed in a second space defined by the first walls 132 of the first partition wall structure layer 130, and the third wavelength conversion portion WC3 may be disposed in a third space defined by the first walls 132 of the first partition wall structure layer 130.

According to an embodiment, the first wavelength conversion portion WC1, the second wavelength conversion portion WC2, and the third wavelength conversion portion WC3 and the first partition wall structure layer 130 may be disposed on the same layer.

According to an embodiment, the first wavelength conversion portion WC1 may be separated from the second wavelength conversion portion WC2 by any one of the first walls 132. The second wavelength conversion portion WC2 may be separated from the third wavelength conversion portion WC3 by another one of the first walls 132.

According to an embodiment, each of the first wavelength conversion portion WC1, the second wavelength conversion portion WC2, and the third wavelength conversion portion WC3 may include the same material.

According to an embodiment, each of the first wavelength conversion portion WC1, the second wavelength conversion portion WC2, and the third wavelength conversion portion WC3 may include a first wavelength conversion material, a second wavelength conversion material, and a base resin, respectively. According to an embodiment, each of the first wavelength conversion portion WC1, the second wavelength conversion portion WC2, and the third wavelength conversion portion WC3 may further include a light scatterer. Each of the first wavelength conversion portion WC1, the second wavelength conversion portion WC2, and the third wavelength conversion portion WC3 may further include transparent material, such as fillers.

According to an embodiment, the first wavelength conversion material may change a wavelength of applied light. According to an example, the first wavelength conversion material may convert blue light into red light. Here, the red light may mean light of which a peak wavelength is about 610 nm to about 650 nm.

According to an embodiment, the second wavelength conversion material may change a wavelength of applied light. According to an example, the second wavelength conversion material may convert blue light into green light. Here, the green light may mean light of which a peak wavelength is 510 nm to 550 nm.

Here, the first wavelength conversion material and the second wavelength conversion material may be quantum dots (hereinafter referred to as "QDs"), quantum rods, or phosphors.

At this time, the QD may refer to a particulate material that emits light of a specific wavelength while an electron transits from a conduction band to a valence band. The QD may be a semiconductor nano crystal material. The QD may have a specific band gap according to composition and a size thereof to absorb light and then emit light having a unique wavelength. An example of the semiconductor nano crystal of the QD may include a group IV nano crystal, a group II-VI compound nano crystal, a group III-V compound nano crystal, a group IV-VI nano crystal, a combination thereof, or the like.

According to an embodiment, the base resin may have high light transmittance and a desirable dispersion characteristic with respect to the first wavelength conversion material and the second wavelength conversion material. According to an example, the base resin may include an organic material such as an epoxy-based resin, an acryl-based resin, a cardo-based resin, or an imide-based resin.

According to an embodiment, the first partition wall structure layer 130 may include an inorganic material. For example, the first partition wall structure layer 130 may include a silicon-based material. The first partition wall structure layer 130 may be a configuration provided by etching an SOI substrate (refer to '100' of FIG. 13).

According to an embodiment, a surface of the first partition wall structure layer 130 may contact (or may be in contact with) the insulating structure layer 120. The first partition wall structure layer 130 may be patterned and formed on the insulating structure layer 120.

According to an embodiment, the first walls 132 may have a predetermined (or selected) thickness T. The first walls 132 may be spaced apart from each other by a predetermined distance L.

According to an embodiment, the thickness T of the first walls 132 may be about 0.3 μm to about 3.0 μm. In another example, the thickness T of the first walls 132 may be about 0.5 μm to about 2.5 μm. In another example, the thickness T of the first walls 132 may be in a range from about 1 μm to about 4 μm. The thickness T of the first walls 132 may be about 2 μm. The thickness T of the first walls 132 may be about 2.5 μm. The first walls 132 may be spaced apart from each other to define a space.

According to an embodiment, the distance L at which the first walls 132 are spaced apart from each other may be about 1.5 μm to about 7.0 μm. In another example, the distance L at which the first walls 132 are spaced apart from each other may be about 4 μm to about 7 μm. In another example, the distance L at which the first walls 132 are spaced apart from each other may be 2.2 μm to 6.0 μm. In another example, the distance L at which the first walls 132 are spaced apart from each other may be about 3.0 μm to about 5.0 μm. In another example, the distance L at which the first walls 132 are spaced apart from each other may be about 5.5 μm. According to an embodiment, the distance L at which the first walls 132 may mean a width of an opening formed by the first walls 132.

According to an embodiment, the distance L at which the first walls 132 are spaced apart from each other with respect to the thickness T of the first walls 132 may have a predetermined ratio. According to an example, the predetermined (or selected) ratio may be about 1 to about 5. In another example, the predetermined ratio may be about 2.0 to about 4.5. For example, a ratio (L/T) of 5.5/2.5 may be adopted in a display device having 2000 ppi (e.g., 1920×1080, 0.7"), and a ratio of (L/T) of 2.2/0.5 may be adopted in a display device having 6000 ppi (e.g., 1800×1350, 0.36"). The embodiments are of course not limited thereto, and various dimensions may be adopted in various display devices.

According to an embodiment, each of the first partition wall structure layer 130 and the insulating structure layer 120 may have a predetermined height. Details related to this are described below with reference to FIG. 13.

According to an embodiment, the first reflective layer 142 may be disposed on an inner surface of the wall defined by the first partition wall structure layer 130. The first reflective layer 142 may be disposed on an inner surface of the first walls 132.

For example, the first reflective layer 142 may include a (1-1)-th reflective layer, a (1-2)-th reflective layer, and a (1-3)-th reflective layer. At this time, the (1-1)-th reflective layer may be disposed on an inner surface of a space in which the first wavelength conversion portion WC1 is disposed, the (1-2)-th reflective layer may be disposed on an inner surface of a space in which the second wavelength conversion portion WC2 is disposed, and the (1-3)-th reflective layer may be disposed on an inner surface of a space in which the third wavelength conversion portion WC3 is disposed.

According to an embodiment, the first reflective layer 142 may include a reflective material. For example, the first reflective layer 142 may include an Al or Ag-based material, but is not limited thereto. The first reflective layer 142 may reflect the light passing through the color conversion part CCL in the display direction (for example, the third direction DR3) of the pixel PXL to improve the light emission efficiency of the pixel PXL.

According to an embodiment, the insulating structure layer 120 may be disposed between the color filter part CFL and the first partition wall structure layer 130. The insulating structure layer 120 may be an oxide insulating layer. For example, the insulating structure layer 120 may include silicon oxide ($SiO_x$). According to embodiment, silicon oxide ($SiO_x$) may be silicon dioxide ($SiO_2$).

Details of the insulating structure layer 120 and the first partition wall structure layer 130 are described below with reference to FIGS. 7 to 21.

According to an embodiment, the color filter part CFL may include a color filter CF and a planarization layer PLA.

The color filter CF may be disposed on the insulating structure layer 120. The color filter CF may include a first color filter CF1, a second color filter CF2, and a third color filter CF3.

According to an embodiment, the first color filter CF1 may overlap the first wavelength conversion portion WC1 in a plan view. The first color filter CF1 may be disposed in the emission area EMA of the first pixel PXL1. The first color filter CF1 may transmit light of a first color, and may not transmit, e.g., light of a second color and light of a third color. The first color filter CF1 may include a colorant related to the first color. The first color may be red.

According to an embodiment, the second color filter CF2 may overlap the second wavelength conversion portion WC2 in a plan view. The second color filter CF2 may be disposed in the emission area EMA of the second pixel PXL2. The second color filter CF2 may transmit the light of the second color, and may not transmit, e.g., the light of the first color and the light of the third color. The second color filter CF2 may include a colorant related to the second color. The second color may be green.

According to an embodiment, the third color filter CF3 may overlap the third wavelength conversion portion WC3 in a plan view. The third color filter CF3 may be disposed in the emission area EMA of the third pixel PXL3. The third color filter CF3 may transmit the light of the third color, and may not transmit the light of the first color and the light of the second color. The third color filter CF3 may include a colorant related to the third color. The third color may be blue.

According to an embodiment, at least one of the first wavelength conversion portion WC1, the first color filter CF1, and the light emitting element LD may define the first pixel PXL1. At least one of the second wavelength conversion portion WC2, the second color filter CF2, and the light emitting element LD may define the second pixel PXL2. At least one of the third wavelength conversion portion WC3, the third color filter CF3, and the light emitting element LD may define the third pixel PXL3.

According to an embodiment, the light emitting element LD disposed in the emission area EMA of the first pixel PXL1 may emit first light. The first light may pass through the first wavelength conversion portion WC1 and the first color filter CF1 and may be provided as the light of the first color. The light emitting element LD disposed in the emission area EMA of the second pixel PXL2 may emit second light. The second light may pass through the second wavelength conversion portion WC2 and the second color filter CF2 and may be provided as the light of the second color. The light emitting element LD disposed in the emission area EMA of the third pixel PXL3 may emit third light. The third light may pass through the third wavelength conversion portion WC3 and the third color filter CF3 and may be provided as the light of the third color.

According to an embodiment, the planarization layer PLA may be disposed on the color filter CF. The planarization layer PLA may cover the first to third color filters CF1 to CF3. The planarization layer PLA may offset a step difference (or height or thickness difference) caused by the color filter CF.

Next, the display device DD according to the second embodiment is described with reference to FIG. 4. Contents that may be repetitive to the contents described above are omitted or simplified.

The display device DD according to the second embodiment is different from the display device DD according to the first embodiment at least in that configurations disposed in each of the first wavelength conversion portion WC1 and the second wavelength conversion portion WC2 are different from each other. In addition, the display device DD according to the second embodiment is different from the display device DD according to the first embodiment at least in that the display device DD according to the second embodiment further includes a light transmission portion LTL.

According to an embodiment, the first wavelength conversion portion WC1, the second wavelength conversion portion WC2, and the light transmission portion LTL may be disposed on the same layer.

According to an embodiment, the light transmission portion LTL may be provided in a space defined by the first walls 132 of the first partition wall structure layer 130.

According to an embodiment, the first wavelength conversion portion WC1, the second wavelength conversion portion WC2, and the light transmission portion LTL may include different materials.

According to an embodiment, the first wavelength conversion portion WC1 may include a first wavelength conversion material and a base resin. According to an example, as described above, the first wavelength conversion material may convert the blue light into the red light.

According to an embodiment, the second wavelength conversion portion WC2 may include a second wavelength conversion material and a base resin. According to an example, as described above, the second wavelength conversion material may convert the blue light into the green light.

According to an embodiment, the light transmission portion LTL may include a base resin and a scatterer. Here, the base resin may include an organic material such as an epoxy-based resin, an acryl-based resin, a cardo-based resin, or an imide-based resin. In addition, the scatterer may be a light scattering particle, and may have a refractive index different from that of the base resin. However, an embodiment of the light transmission portion LTL is not limited to the above-described example. According to an example, the light transmission portion LTL may be provided in a form including a filler. According to an example, the light transmission portion LTL may transmit the blue light.

Next, the display device DD according to the third embodiment is described with reference to FIG. 5.

The display device DD according to the third embodiment is different from the display device DD according to the first and second embodiments at least in that the display device DD according to the third embodiment further includes a second partition wall structure layer (or second layer including partition walls or banks) 150.

According to an embodiment, the second partition wall structure layer 150 may be disposed on the first protective layer PSV1. The second partition wall structure layer 150 may be disposed between the first partition wall structure layer 130 and the display element part DPL. The second partition wall structure layer 150 may include openings.

According to an embodiment, the second partition wall structure layer 150 may include an organic material. According to an example, the second partition wall structure layer 150 may be formed by depositing an organic material on the first partition wall structure layer 130.

In another example, according to an embodiment, the second partition wall structure layer 150 may include a black matrix. For example, the black matrix may include a light blocking material. According to the embodiment, a path of the light emitted from the light emitting element LD may be clearly defined, and thus image quality of the display device DD may be further improved.

According to an embodiment, the second partition wall structure layer 150 may include second walls (or second banks) 152. The second walls 152 may be spaced apart from each other to define a space.

According to an embodiment, each of a first additional wavelength conversion portion AWC1, a second additional wavelength conversion portion AWC2, and a third additional wavelength conversion portion AWC3 may be disposed in the space defined by the second partition wall structure layer 150.

For example, the first additional wavelength conversion portion AWC1 may be disposed in a first space defined by the second walls 152 of the second partition wall structure layer 150, the second additional wavelength conversion portion AWC2 may be disposed in a second space defined by the second walls 152 of the second partition wall structure layer 150, and the third additional wavelength conversion portion AWC3 may be disposed in a third space defined by the second walls 152 of the second partition wall structure layer 150.

According to an embodiment, the first additional wavelength conversion portion AWC1 may be separated from the second additional wavelength conversion portion AWC2 by any one of the second walls 152. The second additional wavelength conversion portion AWC2 may be separated from the third additional wavelength conversion portion AWC3 by another one of the second walls 152.

According to an embodiment, the first additional wavelength conversion portion AWC1 may be disposed in the emission area EMA of the first pixel PXL1. The second additional wavelength conversion portion AWC2 may be disposed in the emission area EMA of the second pixel PXL2. The third additional wavelength conversion portion AWC3 may be disposed in the emission area EMA of the third pixel PXL3.

According to an embodiment, the first additional wavelength conversion portion AWC1, the second additional wavelength conversion portion AWC2, and the third additional wavelength conversion portion AWC3 may include the same material.

According to an embodiment, the first additional wavelength conversion portion AWC1, the second additional wavelength conversion portion AWC2, and the third additional wavelength conversion portion AWC3 may include a first wavelength conversion material, a second wavelength conversion material, and a base resin.

According to an embodiment, the first wavelength conversion portion WC1 and the first additional wavelength conversion portion AWC1 may include the same material. The second wavelength conversion portion WC2 and the second additional wavelength conversion portion AWC2 may include the same material. The third wavelength conversion portion WC3 and the third additional wavelength conversion portion AWC3 may include the same material.

According to an embodiment, a second protective layer PSV2 may be disposed on the second partition wall structure layer 150. The second protective layer PSV may be connected to the adhesive layer ADS. The second protective layer PSV2 may cover (or overlap in a plan view) the first additional wavelength conversion portion AWC1, the second additional wavelength conversion portion AWC2, and the third additional wavelength conversion portion AWC3. The second protective layer PSV2 may include an organic material or an inorganic material, but is not limited to a specific example.

According to an embodiment, a second reflective layer 144 may be disposed on an inner surface of a wall defined by the second partition wall structure layer 150. The second reflective layer 144 may be disposed on an inner surface of the second walls 152.

For example, the second reflective layer 144 may include a (2-1)-th reflective layer, a (2-2)-th reflective layer, and a (2-3)-th reflective layer. At this time, the (2-1)-th reflective layer may be disposed on an inner surface of a space in which the first additional wavelength conversion portion AWC1 is disposed, the (2-2)-th reflective layer may be disposed on an inner surface of a space in which the second additional wavelength conversion portion AWC2 is disposed, and the (2-3)-th reflective layer may be disposed on an inner surface of a space in which the third additional wavelength conversion portion AWC3 is disposed.

According to an embodiment, the second reflective layer 144 may include a reflective material. For example, the second reflective layer 144 may include an Al or Ag-based material, but is not limited thereto. The second reflective layer 144 may reflect the light passing through the color conversion part CCL in the display direction (for example, the third direction DR3) of the pixel PXL to improve the light emission efficiency of the pixel PXL.

Next, the display device DD according to the fourth embodiment is described with reference to FIG. 6.

The display device DD according to the fourth embodiment is different from the display device DD according to the third embodiment at least in that a configuration disposed in the first wavelength conversion portion WC1 and a configuration disposed in the first additional wavelength conversion portion AWC1 are different from each other, a configuration disposed in the second wavelength conversion portion WC2 and a configuration disposed in the second additional wavelength conversion portion AWC2 are different from each other, and a configuration disposed in the third wavelength conversion portion WC3 and a configuration disposed in the third additional wavelength conversion portion AWC3 are different from each other.

According to an embodiment, the first wavelength conversion portion WC1 may include a first wavelength conversion material and a base resin. The first additional wavelength conversion portion AWC1 may include a second wavelength conversion material and a base resin.

According to an embodiment, the second wavelength conversion portion WC2 may include the first wavelength conversion material and the base resin. The second additional wavelength conversion portion AWC2 may include the second wavelength conversion material and the base resin.

According to an embodiment, the third wavelength conversion portion WC3 may include the first wavelength conversion material and the base resin. The third additional wavelength conversion portion AWC3 may include the second wavelength conversion material and the base resin.

According to the embodiment, a color of light transmitted through the first wavelength conversion portion WC1 and the first additional wavelength conversion portion AWC1, a color of light transmitted through the second wavelength conversion portion WC2 and the second additional wavelength conversion portion AWC2, a color of light transmitted through the third wavelength conversion portion WC3 and the third additional wavelength conversion portion AWC3 may be the same.

According to an example, all of the light transmitted through the first wavelength conversion portion WC1 and the first additional wavelength conversion portion AWC1, light transmitted through the second wavelength conversion portion WC2 and the second additional wavelength conversion portion AWC2, and the light transmitted through the third wavelength conversion portion WC3 and the third additional wavelength conversion portion AWC3 may be blue light.

Hereinafter, a method of manufacturing the display device DD according to an embodiment is described with reference to FIGS. 7 to 23.

FIGS. 7 to 24 are schematic cross-sectional views for each process step illustrating a method of manufacturing a display device according to an embodiment.

Figure 20:
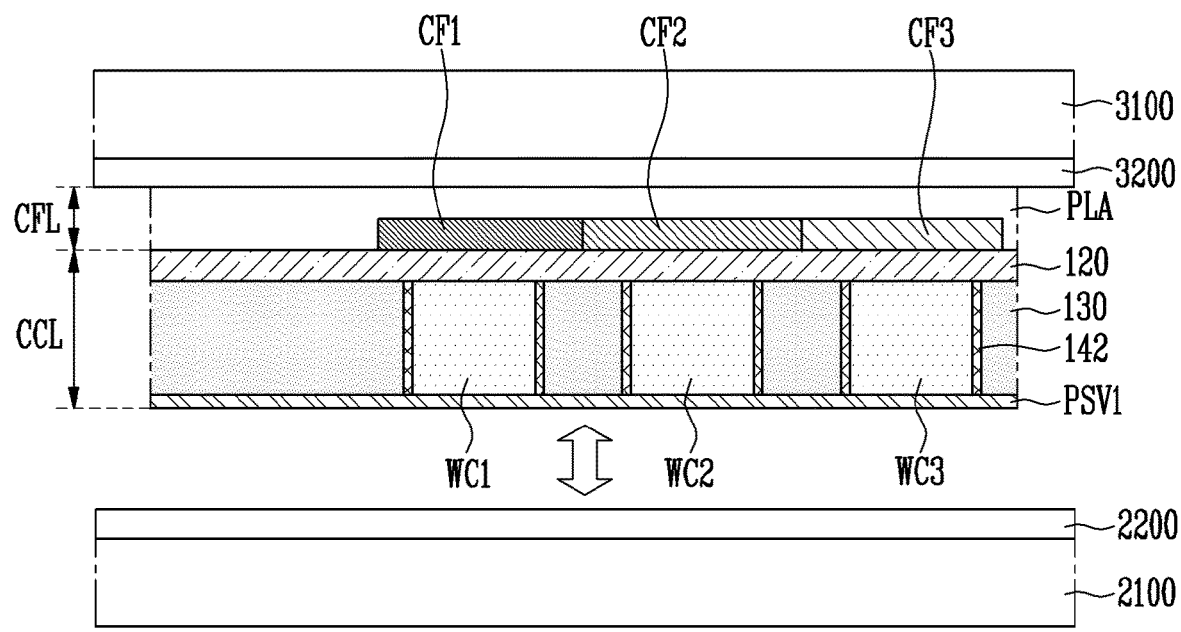
Figure 21:
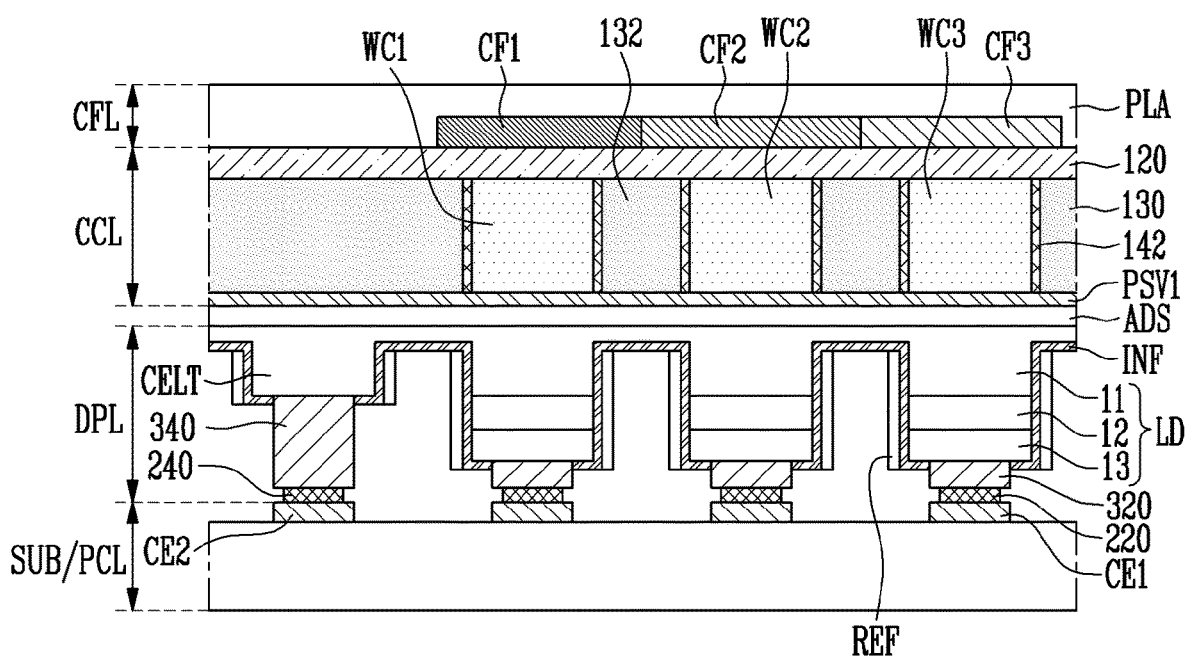
Figure 22:
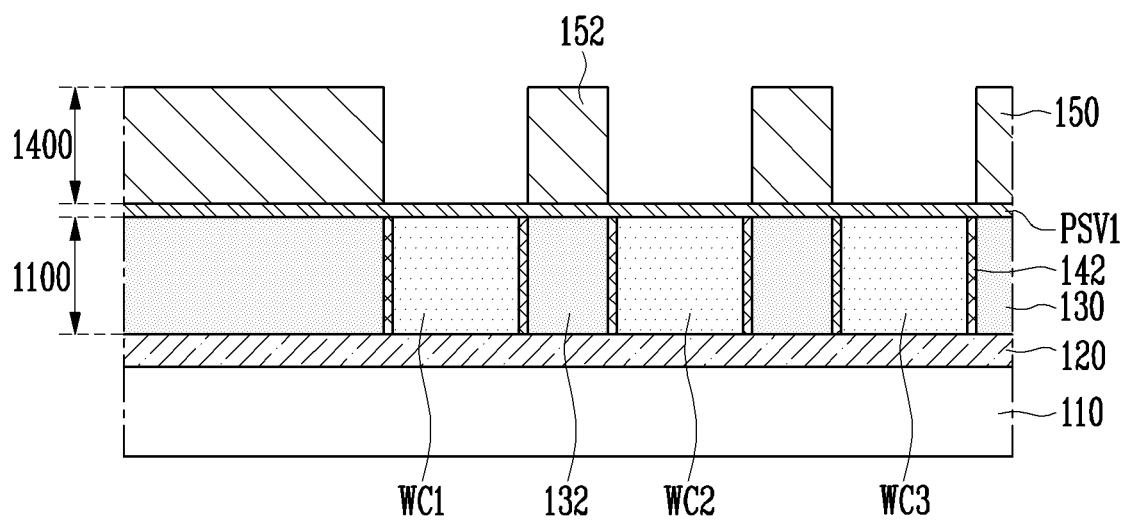
Figure 23:
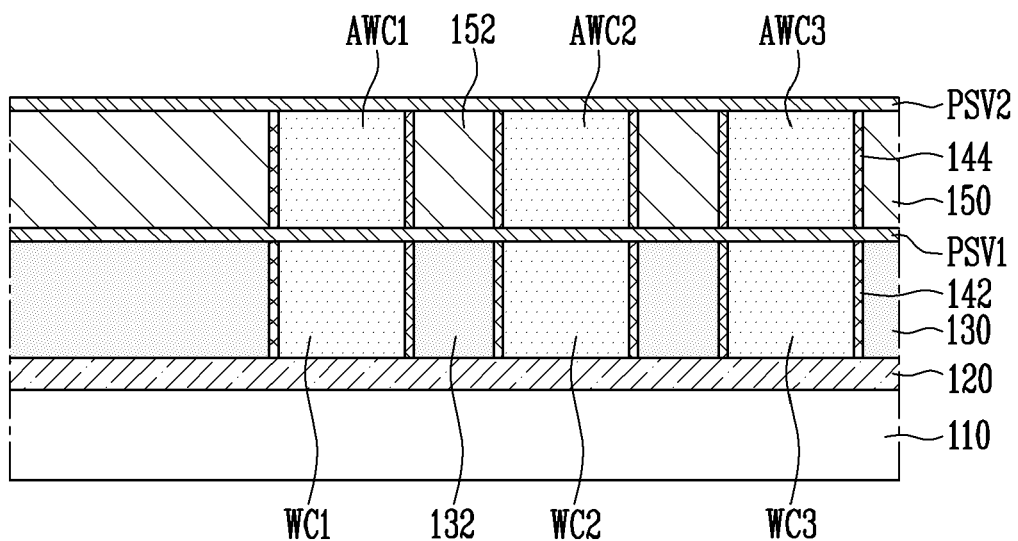
Figure 24:
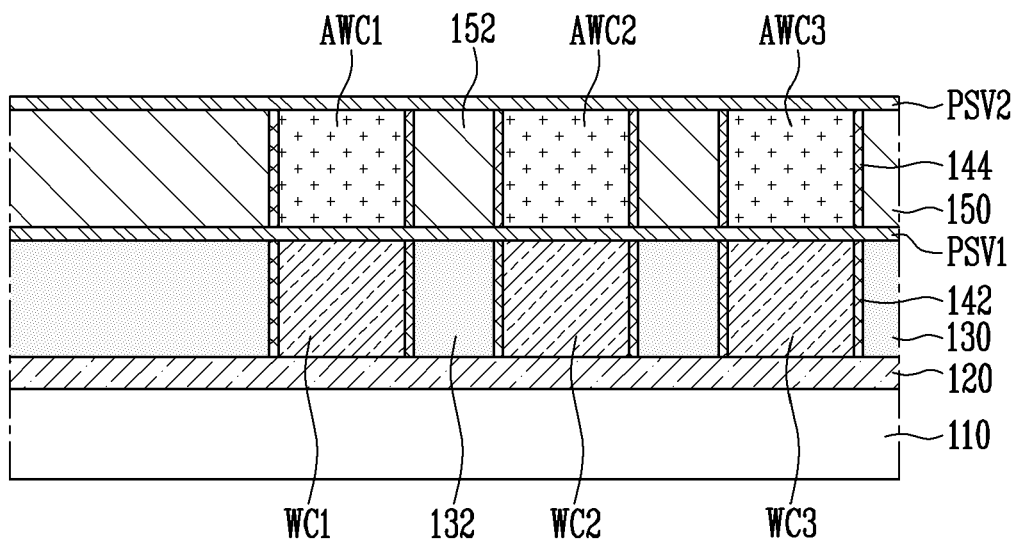

FIGS. 7 to 21 are schematic cross-sectional views illustrating a method of manufacturing the display device DD according to the first embodiment. FIGS. 22 and 23 are schematic cross-sectional views illustrating a method of manufacturing the display device DD according to the third embodiment. FIG. 24 is a schematic cross-sectional view illustrating a method of manufacturing the display device DD according to the fourth embodiment.

First, the method of manufacturing the display device DD according to the first embodiment is described with reference to FIGS. 7 to 21.

FIGS. 7 to 11 may be a step of providing the display element part DPL.

Figure 7:
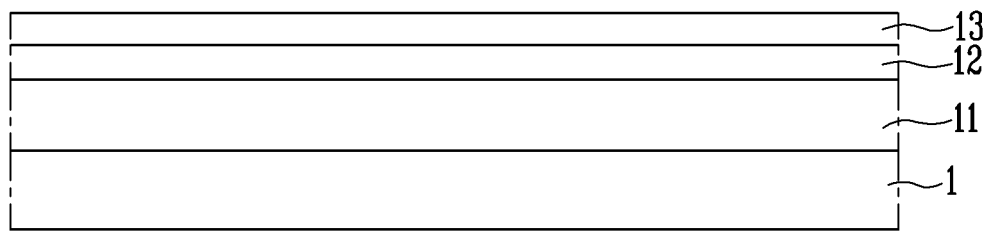
FIGS. 7 to 24 are schematic cross-sectional views for each process step illustrating a method of manufacturing a display device according to an embodiment.

Referring to FIG. 7, a stack substrate 1 may be prepared (or provided), and the first semiconductor layer 11, the active layer 12, and the second semiconductor layer 13 may be formed on the stack substrate 1.

According to an embodiment, the stack substrate 1 may be a base plate for stacking a target material. The stack substrate 1 may be a wafer for epitaxial growth of a predetermined material. According to an example, the stack substrate 1 may be any one of a sapphire substrate, a GaAs substrate, a Ga substrate, and an InP substrate, but is not limited thereto. For example, when a specific material satisfies selectivity for manufacturing the light emitting element LD and epitaxial growth for a predetermined material may be smoothly generated, the specific material may be selected as a material of the stack substrate 1.

In the present step, the first semiconductor layer 11, the active layer 12, and the second semiconductor layer 13 may be formed by any one method among metal organic chemical vapor deposition (MOCVD), molecular beam epitaxy (MBE), vapor phase epitaxy (VPE), and liquid phase epitaxy (LPE).

Figure 8:
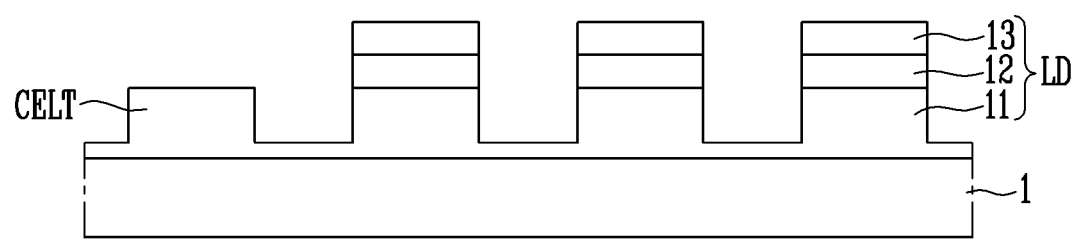

Referring to FIG. 8, the light emitting elements LD and the common electrode CELT separated from each other may be provided by removing at least a portion of each of the first semiconductor layer 11, the active layer 12, and the second semiconductor layer 13.

In the present step, an etching process on the first semiconductor layer 11, the active layer 12, and the second semiconductor layer 13 may be performed. Patterning at a nano scale or micro scale distance may be performed by disposing a mask (not shown) in a structure in which the first semiconductor layer 11, the active layer 12, and the second semiconductor layer 13 are sequentially stacked and performing an etching process. The etching process may be performed in a direction from the second semiconductor layer 13 toward the first semiconductor layer 11.

In the present step, the active layer 12 and the second semiconductor layer 13 positioned in an area where the common electrode CELT is to be disposed may be removed. Accordingly, a height of the common electrode CELT may be less than a height of the light emitting element LD.

Figure 9:
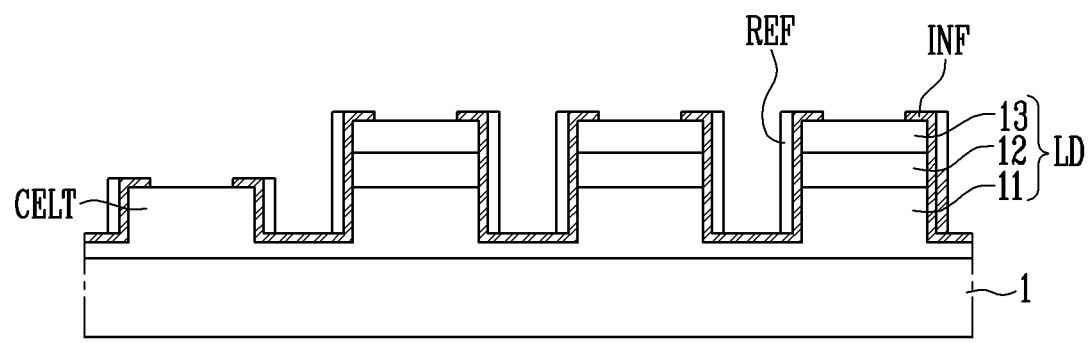

Referring to FIG. 9, the insulating layer INF and the reflective partition wall REF may be formed. The insulating layer INF may be disposed on an outer surface of the common electrode CETL and the light emitting element LD, and the reflective partition wall REF may be disposed on the insulating layer INF. According to an embodiment, the insulating layer INF and the reflective partition wall REF may be disposed, and a space where the first bump 320 and the second bump 340 may be respectively connected to the light emitting element LD and the common electrode CELT may be provided.

In the present step, the insulating layer INF may be provided by forming an insulating layer on the entire surface and removing at least a portion of the insulating layer. Here, the first bump 320 and the second bump 340 may be disposed in an area where the insulating layer is removed according to a process. For example, the first bump 320 and second bump 340 may include AuSn (e.g., 9:1, 8:2, or 7:3), SAC305, Cu, Au, or Sn but are not limited thereto.

In the present step, the reflective partition wall REF may be provided by forming a reflective layer on the entire surface and removing at least a portion of the reflective layer. Here, the first bump 320 and the second bump 340 may be disposed in an area where the reflective layer is removed according to a later process.

Figure 10:
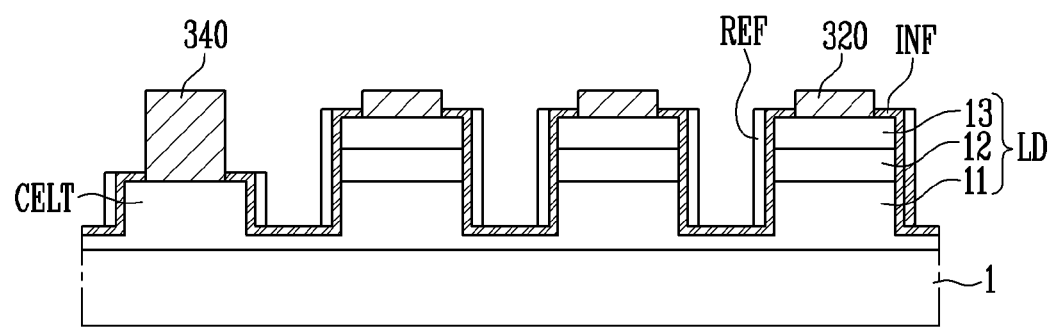

Referring to FIG. 10, the first bump 320 may be formed on the light emitting element LD, and the second bump 340 may be formed on the common electrode CELT.

In the present step, the first bump 320 may be connected to the light emitting element LD, and the second bump 340 may be connected to the common electrode CELT.

Figure 11:
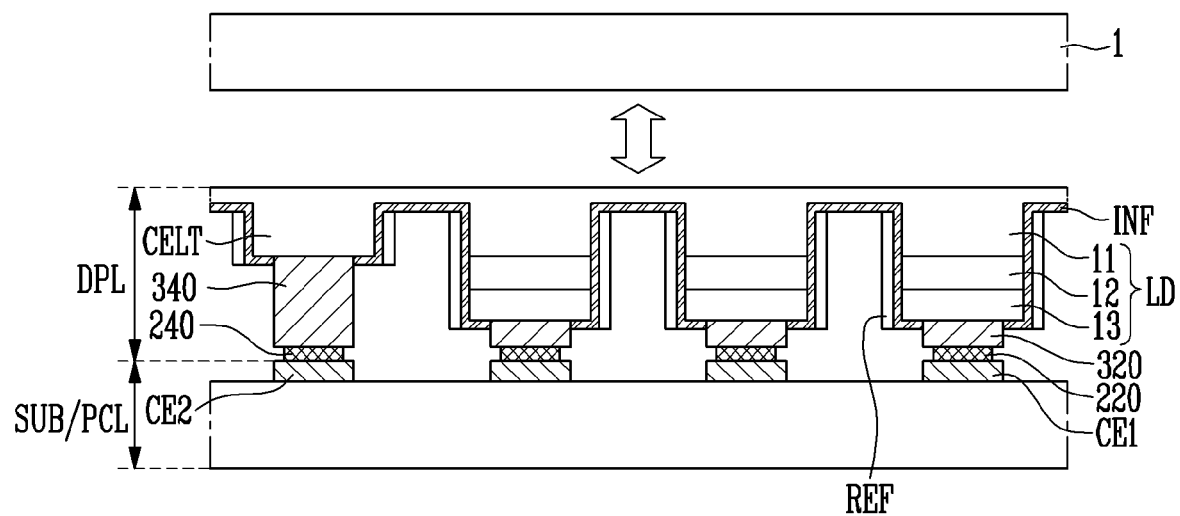

Referring to FIG. 11, the first bump 320 may be combined to the first conductive connector 220, and the second bump 340 may be combined to the second conductive connector 240. In addition, the stack substrate 1 may be separated from the first semiconductor layer 11.

According to an example, a method in which the first bump 320 and the first conductive connector 220 are connected and a method in which the second bump 340 and the second conductive connector 240 are connected may be, e.g., flip chip bonding methods, but are not limited thereto.

According to an embodiment, the first conductive connector 220 and the second conductive connector 240 may not be included. In this case, the first bump 320 may be connected to the CMOS cell CE1, and the second bump 340 may be connected to the common cell CE2. For example, the present step may refer to a step in which the first bump 320 is connected to the CMOS cell CE1 and the second bump 340 is connected to the common cell CE2.

In the present step, the stack substrate 1 may be physically separated from the first semiconductor layer 11. According to an example, the stack substrate 1 and the first semiconductor layer 11 may be separated by a laser lift-off (LLO) method. However, the disclosure is not limited thereto, and according to an embodiment, the stack substrate 1 and the first semiconductor layer 11 may be separated by a chemical lift-off (CLO) method.

By performing the present step, the substrate SUB, the pixel circuit part PCL disposed on the substrate, and the display element part DPL disposed on the pixel circuit part PCL may be provided (or prepared).

Meanwhile, a method of manufacturing the light control part LCP is described with reference to FIGS. 12 to 21.

FIGS. 12 to 19 may be diagrams illustrating a method of providing the color conversion part CCL. FIG. 20 may be a diagram illustrating a method of providing the color filter part CFL. FIG. 21 may be a diagram illustrating a method of combining the display element part DPL and the light control part LCP including the color conversion part CCL and the color filter CFL.

Figure 12:
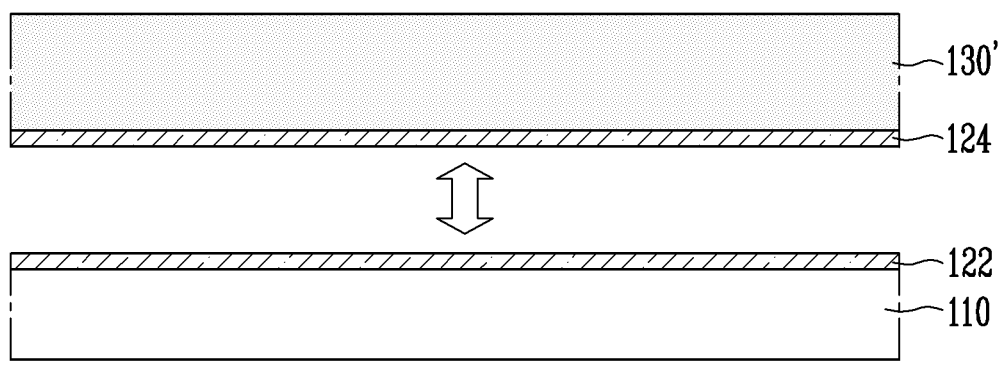
Figure 13:
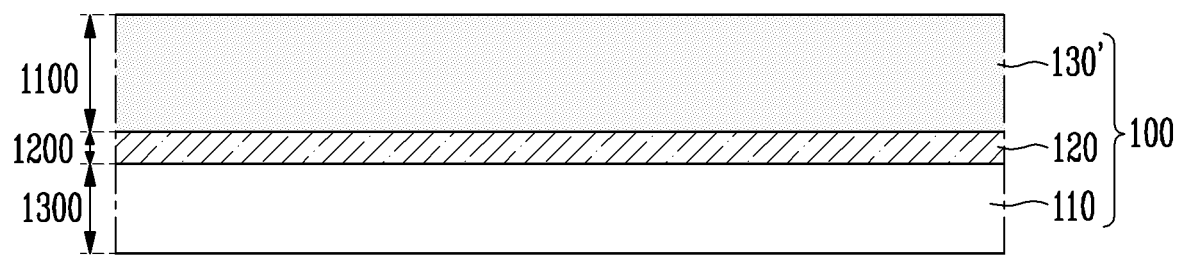

Referring to FIGS. 12 and 13, a silicon on insulator (SOI) substrate 100 may be prepared (or provided). According to an embodiment, the SOI substrate 100 may have a structure in which an insulator is interposed between configurations including silicon. For example, the SOI substrate 100 may include a base substrate 110, the insulating structure layer 120, and a first base structure layer 130'.

According to an embodiment, the base substrate 110 may be a silicon substrate. The insulating structure layer 120 may include silicon oxide ($SiO_x$). The first base structure layer 130' may include a silicon-based material.

In the present step, a first insulating layer 122 may be formed on the base substrate 110, and a second insulating layer 124 may be formed on the first base structure layer 130'. Thereafter, the SOI substrate 100 may be provided by combining the first insulating layer 122 and the second insulating layer 124. According to an example, the first insulating layer 122 and the second insulating layer 124 may be manufactured by applying a thermal oxidation process to each of the base substrate 110 and the first base structure layer 130'. The first insulating layer 122 and the second insulating layer 124 may be formed by a separation by implanted oxygen (SIMOX) process.

According to an embodiment, a thickness of the first insulating layer 122 and the second insulating layer 124 may be appropriately selected according to a thickness of the insulating structure layer 120 to be provided in a subsequent process. For example, when the thickness of the insulating structure layer 120 is to be provided as 2 μm, the thickness of each of the first insulating layer 122 and the second insulating layer 124 may be 1 μm.

However, according to an embodiment, the SOI substrate 100 may be manufactured by a different method. For example, the SOI substrate 100 may be provided by directly forming the insulating structure layer 120 on the base substrate 110, and forming the first base structure layer 130' on the insulating structure layer 120. For example, the base substrate 110 may be prepared (or provided), and the insulating structure layer 120 and the first base structure layer 130' may be disposed on the base substrate 110.

According to an embodiment, the first base structure layer 130' may have a first height 1100. The insulating structure layer 120 may have a second height 1200. The base substrate 110 may have a third height 1300.

According to an embodiment, the first height 1100 may be about 3 μm or more. For example, the first height 1100 may be in a range from about 3 μm to about 7 μm. In another example, the first height 1100 may be about 3 μm or about 5 μm. In another example, the third height 1300 may be about 5 μm or more. However, the first height 1100 may be appropriately selected according to a height of the color conversion part CCL to be manufactured later (or an amount of each of the first to third wavelength conversion portions WC1 to WC3).

According to an embodiment, the second height 1200 may be about 3 µm or less. In another example, the second height 1200 may be about 1 µm to about 3 µm. In another example, the second height 1200 may be about 2 µm. In another example, the second height 1200 may be about 1.2 µm. In another example, the second height 1200 may be about 1.5 µm to about 2.5 µm. In another example, the second height 1200 may be about 1.9 µm to about 2.1 µm.

According to an embodiment, the third height 1300 may be about 3 µm to about 7 µm. In another example, the third height 1300 may be about 4 µm to about 6 µm. In another example, the third height 1300 may be about 4.5 µm to about 5.5 µm.

Figure 14:
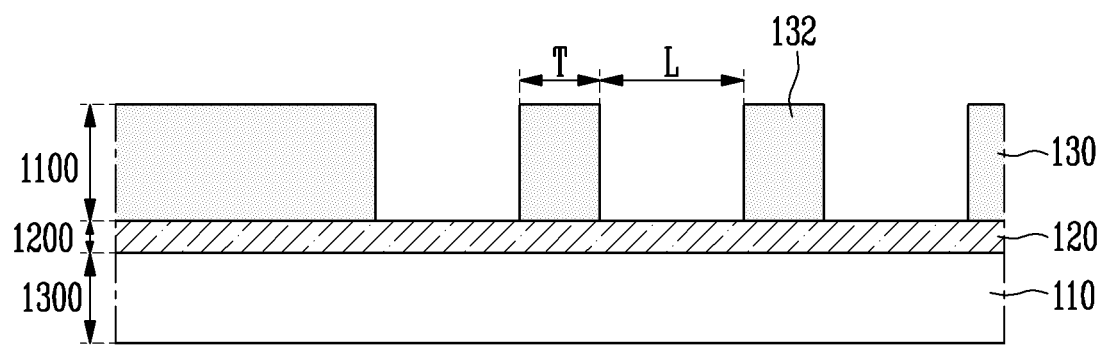

Referring to FIG. 14, the first base structure layer 130' may be etched to provide the first partition wall structure layer 130 including the first walls 132.

In the present step, an area from which the first base structure layer 130' is removed may correspond to an area where the first wavelength conversion portion WC1, the second wavelength conversion portion WC2, and the third wavelength conversion portion WC3 are disposed as a subsequent process is performed.

In the present step, an etching process on the first base structure layer 130' may be performed. According to an example, the etching process may be a deep reactive ion etching (DRIE) process.

In the present step, the etching process may be performed so that a distance between the walls of the first partition wall structure layer 130 and a thickness of the wall satisfy a predetermined (or selected) numerical range.

For example, as the etching process is performed, the first walls 132 may have a predetermined thickness T, and the first walls 132 may be spaced apart from each other by a predetermined distance L.

The first partition wall structure layer 130 provided in the present step may have the first height 1100. As described above, the first height 1100 may be about 3 µm or more. In another example, the third height 1300 may be about 5 µm or more.

In the space defined by the first walls 132 of the first partition wall structure layer 130 provided in the present step, at least one of the first to third wavelength conversion portions WC1 to WC3 may be disposed as a subsequent process is performed. Experimentally, in order to improve the resolution of the display device DD, the individual pixels PXL are required to be finely divided. For example, a process is required to be performed so that the predetermined thickness T and the predetermined distance L are appropriately selected. According to an embodiment of the disclosure, a configuration related to the first partition wall structure layer 130 provided with the first to third wavelength conversion portions WC1 to WC3 may be derived from the SOI substrate 100 (for example, the etching process is performed), and thus a more fine etching process may be performed. Accordingly, as a result, the resolution and screen quality of the display device DD may be further improved.

Figure 15:
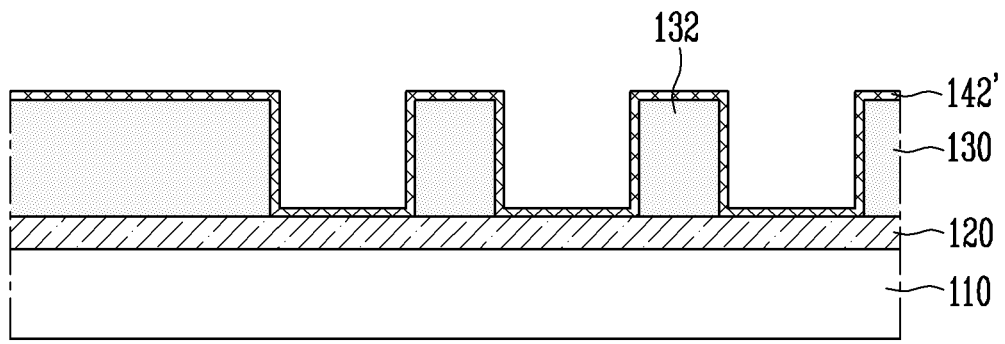

Referring to FIG. 15, a base reflective layer 142' may be deposited. The base reflective layer 142' may be disposed to cover (or overlap in a plan view) the first partition wall structure layer 130. According to an embodiment, the base reflective layer 142' may include a reflective material.

In the present step, the base reflective layer 142' may be arranged on at least an inner surface of the first walls 132.

Figure 16:
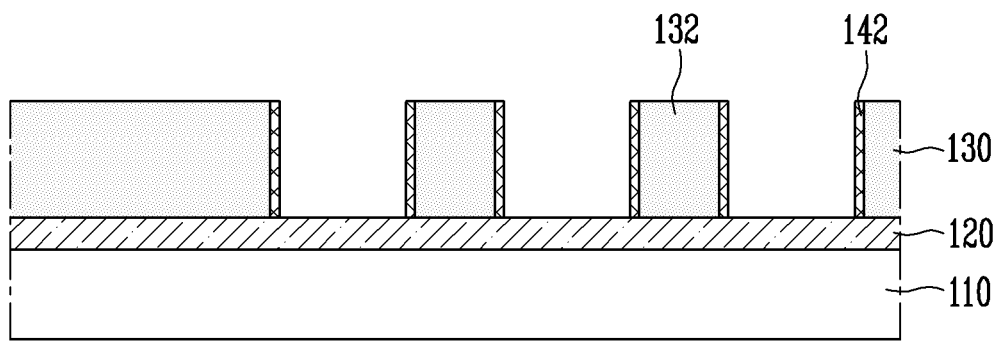

Referring to FIG. 16, at least a portion of the base reflective layer 142' may be removed to provide the first reflective layer 142.

In the present step, the base reflective layer 142' disposed on an upper surface of the first partition wall structure layer 130 may be removed to provide the first reflective layer 142 functioning as a reflective partition wall.

Figure 17:
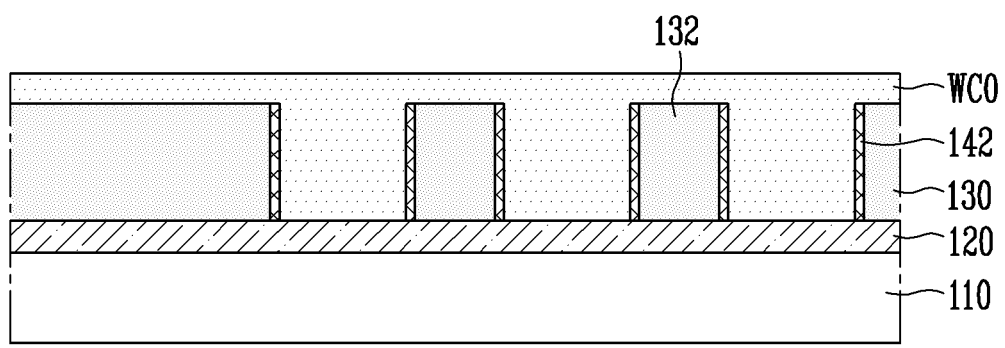

Referring to FIG. 17, a base wavelength conversion portion WC0 may be provided. The base wavelength conversion portion WC0 may include the first wavelength conversion material, the second wavelength conversion material, and the base resin. As described above, the first wavelength conversion material and the second wavelength conversion material may respectively change wavelengths of applied light.

In the present step, the base wavelength conversion portion WC0 may be provided at least in the space defined by the first walls 132 of the first partition wall structure layer 130.

Figure 18:
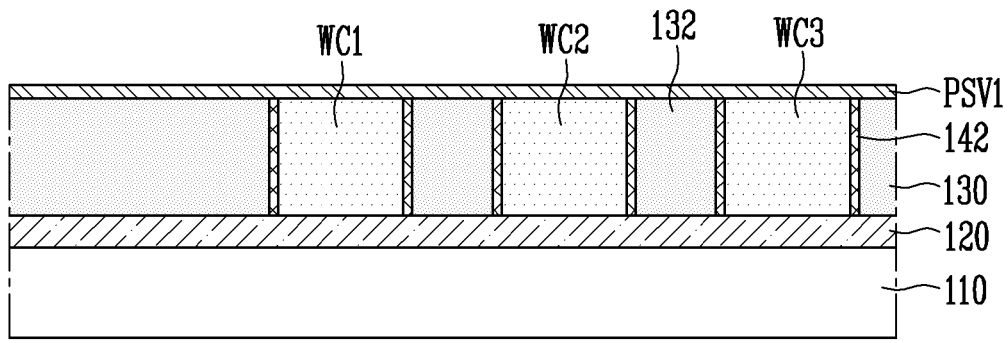

Referring to FIG. 18, a portion of the base wavelength conversion portion WC0 may be removed to provide the first wavelength conversion portion WC1, the second wavelength conversion portion WC2, and the third wavelength conversion portion WC3. According to an embodiment, the present step may be performed by a slit coating process.

In the present step, each of the first wavelength conversion portion WC1, the second wavelength conversion portion WC2, and the third wavelength conversion portion WC3 may be provided in the space defined by the first walls 132. For example, the first wavelength conversion portion WC1, the second wavelength conversion portion WC2, and the third wavelength conversion portion WC3 may be physically separated from each other by at least one of the first walls 132.

Thereafter, the first protective layer PSV1 may be formed to cover the first wavelength conversion portion WC1, the second wavelength conversion portion WC2, and the third wavelength conversion portion WC3. Here, the first protective layer PSV1 may seal the first wavelength conversion portion WC1, the second wavelength conversion portion WC2, and the third wavelength conversion portion WC3 to attenuate an external influence.

Figure 19:
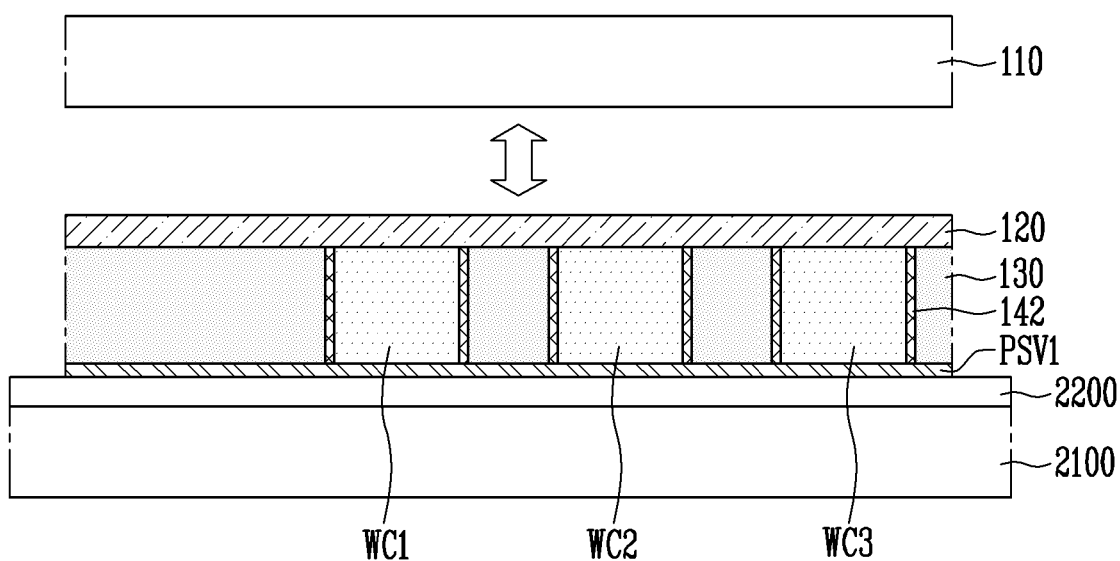

Referring to FIG. 19, the base substrate 110 may be separated from the insulating structure layer 120. In addition, a first carrier wafer 2100 and a first attachment film 2200 may be combined with the first protective layer PSV1. For example, the base substrate 110 may be removed by a CMR (controlled material-removal) or dry etching process, etc.

According to an embodiment, the first attachment film 2200 may have an adhesive force. Therefore, one surface of the first attachment film 2200 may be connected to the first carrier wafer 2100, and another surface of the first attachment film 2200 may be connected to the first protective layer PSV1.

In the present step, the first carrier wafer 2100 may be a configuration temporarily bonded to the first protective layer PSV1 to perform a subsequent process, and may be separated (debonded) after performing the subsequent process.

Referring to FIG. 20, the color filter part CFL may be combined to the insulating structure layer 120. Here, the color filter part CFL combined to the insulating structure layer 120 may be combined to a second carrier wafer 3100 by a second attachment film 3200 to be prepared.

According to the embodiment, the second attachment film 3200 may have an adhesive force, and thus one surface of the second attachment film 3200 may be connected to the second carrier wafer 3100, and another surface of the second attachment film 3200 may be connected to the planarization layer PLA of the filter portion CFL.

In the present step, after the color filter part CFL is connected to the insulating structure layer 120, the first attachment film 2200 and the first carrier wafer 2100 may be separated from the first protective layer PSV1.

According to an embodiment, although not shown in the drawing, a separate adhesive layer may be further interposed between the color filter part CFL and the insulating structure layer 120.

In the present step, the color filter part CFL may be connected to the insulating structure layer 120, and thus the first color filter CF1 overlapping the first wavelength conversion portion WC1 in a plan view, the second color filter CF2 overlapping the second wavelength conversion portion WC2 in a plan view, and the third color filter CF3 overlapping the third wavelength conversion portion WC3 in a plan view may be provided.

Thereafter, although not shown in the drawing, the planarization layer PLA and the second attachment film 3200 may be separated from each other. Accordingly, the second carrier wafer 3100 and the second attachment film 3220 may be released from the color filter part CFL.

Referring to FIG. 21, the color conversion part CCL and the display element part DPL may be connected. The adhesive layer ADS may be interposed between the color conversion part CCL and the display element part DPL. Therefore, the color conversion part CCL and the display element part DPL may be connected to each other. Accordingly, the display device DD according to the first embodiment may be provided.

Hereinafter, a method of manufacturing the display device DD according to the third embodiment is described with reference to FIGS. 22 and 23. Contents that may be repetitive to the contents described above are simplified or omitted.

Referring to FIG. 22, the second partition wall structure layer 150 may be disposed on the first partition wall structure layer 130. Meanwhile, the first wavelength conversion portion WC1, the second wavelength conversion portion WC2, and the third wavelength conversion portion WC3 including the same material (for example, the first wavelength conversion material and the second wavelength conversion material) and the first partition wall structure layer 130 may be disposed on the same layer.

The second partition wall structure layer 150 provided in the present step may have a second height 1400, which may be about 3 μm or more. The first height 1100 of the first partition wall structure layer 130 and the second height 1400 of the second partition wall structure 150 may be equal to or different from each other.

In the present step, the second partition wall structure layer 150 may be formed on the first protective layer PSV1. According to an example, after forming (or depositing) a second base structure layer (not shown) on the first protective layer PSV1, at least a portion of the second base structure layer may be removed to provide the second partition wall structure layer 150 including the second walls 152.

According to an embodiment, a height of the second base structure layer may be appropriately selected according to an amount of the first to third additional wavelength conversion portions AWC1 to AWC3 provided according to a later process. For example, the height of the second base structure layer may be about 2 μm to about 4 μm.

According to an embodiment, the second base structure layer may include an organic material or a black matrix.

In the present step, a predetermined space may be defined by the second walls 152. Here, the space defined by the second walls 152 may overlap the first wavelength conversion portion WC1, the second wavelength conversion portion WC2, and the third wavelength conversion portion WC3 in a plan view.

According to an embodiment, the second partition wall structure layer 150 may include an organic material. In case that the second partition wall structure layer 150 includes the organic material, the height of the second partition wall structure layer 150 may be sufficiently secured readily. According to an embodiment, the second partition wall structure layer 150 may include a black matrix.

Referring to FIG. 23, each of the first additional wavelength conversion portion AWC1, the second additional wavelength conversion portion AWC2, and the third additional wavelength conversion portion AWC3 may be provided in the space defined by the second walls 152.

In the present step, each of the first additional wavelength conversion portion AWC1, the second additional wavelength conversion portion AWC2, and the third additional wavelength conversion portion AWC3 may include the first wavelength conversion material and the second wavelength conversion material.

In the present step, the first wavelength conversion portion WC1 and the first additional wavelength conversion portion AWC1 may include the same material (for example, the first wavelength conversion material and the second wavelength conversion material). The second wavelength conversion portion WC2 and the second additional wavelength conversion portion AWC2 may include the same material. The third wavelength conversion portion WC3 and the third additional wavelength conversion portion AWC3 may include the same material.

Thereafter, the second protective layer PSV2 may be formed to cover (or overlap in a plan view) the first additional wavelength conversion portion AWC1, the second additional wavelength conversion portion AWC2, and the third additional wavelength conversion portion AWC3.

In addition, thereafter, although not shown in the drawing, the substrate SUB, the pixel circuit part PCL, the display element part DPL, and the color filter part CFL may be provided. Accordingly, the display device DD according to the third embodiment may be provided. For example, after combining the first carrier wafer 2100 to the second protective layer PSV2, the base substrate 110 may be released from the insulating structure layer 120, and the color filter part CFL may be formed on the insulating structure layer 120. In addition, after combining the second carrier wafer 3100 on a surface of the color filter part CFL, the first carrier wafer 2100 may be released from the first protective layer PSV1, and the color conversion part CCL and the color filter part CFL may be disposed on the display element part DPL.

Meanwhile, referring to FIG. 24, the first wavelength conversion portion WC1, the second wavelength conversion portion WC2, the third wavelength conversion portion WC3, the first additional wavelength conversion portion AWC1, the second additional wavelength conversion portion AWC2, and the third additional wavelength conversion portion AWC3 may be manufactured so that materials included in each of the first wavelength conversion portion WC1, the second wavelength conversion portion WC2, the third wavelength conversion portion WC3 and materials included in each of the first additional wavelength conversion portion AWC1, the second additional wavelength conversion portion AWC2, and the third additional wavelength conversion portion AWC3 are different from each other, and thus the display device DD according to the fourth embodiment described above with reference to FIG. 6. may be provided. For example, the display device DD according to the fourth embodiment may be provided so that the first wavelength conversion portion WC1, the second wavelength conversion portion WC2, and the third wavelength conversion portion WC3 include the first wavelength conversion material, and the first additional wavelength conversion portion AWC1, the second additional wavelength conversion portion AWC2, and the third additional wavelength conversion portion AWC3 include the second wavelength conversion portion.

In addition, thereafter, although not shown in the drawing, the substrate SUB, the pixel circuit part PCL, the display element part DPL, and the color filter part CFL may be provided. Accordingly, the display device DD according to the fourth embodiment may be provided. For example, after combining the first carrier wafer 2100 to the second protective layer PSV2, the base substrate 110 may be released from the insulating structure layer 120, and the color filter part CFL may be formed on the insulating structure layer 120. In addition, after combining the second carrier wafer 3100 on one surface of the color filter part CFL, the first carrier wafer 2100 may be released from the first protective layer PSV1, and the color conversion part CCL and the color filter part CFL may be disposed on the display element part DPL.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display element part disposed on a substrate and including a light emitting element; and
a color conversion part disposed on the display element part and changing a wavelength of light emitted from the light emitting element, wherein
the color conversion part includes an insulating structure layer, a first partition wall structure layer, and a first wavelength conversion portion,
the first partition wall structure layer includes first walls, and is disposed between the insulating structure layer and the display element part,
the first wavelength conversion portion is disposed in a space defined by the first walls,
the first partition wall structure layer includes a silicon-based material,
the first walls have a thickness of about 0.3 um to about 3.0 um, and
the first walls are spaced apart from each other by about 1.5 um to about 7.0 um,
wherein the insulating structure layer is a buried oxide (BOX) layer of a silicon-on-insulator (SOI) substrate, and the first walls are integrally formed from single-crystal device silicon of the same SOI substrate, the first walls being contiguous with the BOX layer and produced by etching the device layer of the SOI substrate.

2. The display device according to claim 1, wherein the first partition wall structure layer has a height of about 3 um or more, and the insulating structure layer has a height of about 3 um or less.

3. The display device according to claim 1, wherein
the first walls are disposed directly on the insulating structure layer, and
the insulating structure layer and the first partition wall structure layer being derived from a silicon on insulator substrate.

4. The display device according to claim 1, wherein the first walls are spaced apart by a distance, each of the first walls has a thickness, and a ratio of the distance to the thickness is about 1 to about 5.

5. The display device according to claim 1, wherein the color conversion part includes a second wavelength conversion portion separated from the first wavelength conversion portion by at least part of the first walls, and the first wavelength conversion portion and the second wavelength conversion portion include a first wavelength conversion material and a second wavelength conversion material, respectively.

6. The display device according to claim 1, wherein the color conversion part comprises: a second wavelength conversion portion separated from the first wavelength conversion portion by at least part of the first walls; and a light transmission portion separated from the second wavelength conversion portion by other part of the first walls, the first wavelength conversion portion includes a first wavelength conversion material, the second wavelength conversion portion includes a second wavelength conversion material, and the light transmission portion includes a filler.

7. The display device according to claim 1, further comprising: a first reflective layer disposed on an inner surface of the first walls.

8. The display device according to claim 1, further comprising: a protective layer disposed on the first partition wall structure layer; a second partition wall structure layer disposed on the protective layer and including second walls; and an additional wavelength conversion portion disposed in a space defined by the second walls.

9. The display device according to claim 1, further comprising: a display area and a non-display area surrounding at least a portion of the display area; a common electrode disposed in the non-display area; a first bump electrically connected to the light emitting element; a second bump electrically connected to the common electrode; and a CMOS cell electrically connected to the light emitting element through the first bump.

10. The display device according to claim 5, further comprising: a color filter part disposed on the color conversion part, wherein the color conversion part includes a third wavelength conversion portion separated by other part of the first walls and including the first wavelength conversion material and the second wavelength conversion material, the color filter part includes a first color filter overlapping the first wavelength conversion portion in a plan view, a second color filter overlapping the second wavelength conversion portion in a plan view, and a third color filter overlapping the third wavelength conversion portion in a plan view, at least one of the first wavelength conversion portion, the first color filter, and the light emitting element defines a first pixel, at least one of the second wavelength conversion portion, the second color filter, and the light emitting element defines a second pixel, and at least one of the third wavelength conversion portion, the third color filter, and the light emitting element defines a third pixel.

11. The display device according to claim 1, wherein the insulating structure layer includes silicon oxide (SiOx).

12. The display device according to claim 1, wherein each of the first walls has opposing side surfaces that form an angle of 87° to 90° with respect to the upper surface of the insulating structure layer.

13. The display device according to claim 1, wherein the first walls are monolithic, single-crystal silicon structures formed from the device layer of a silicon-on-insulator substrate and are directly and continuously bonded to the insulating structure layer, which comprises silicon oxide.

14. The display device according to claim 1, wherein the insulating structure layer includes a surface facing the first wavelength conversion portion, and the surface is flat and not curved.

15. An electronic device comprising the display device of claim 1.

* * * * *